United States Patent
Lee et al.

(10) Patent No.: US 12,453,153 B2
(45) Date of Patent: Oct. 21, 2025

(54) WORK-FUNCTION LAYERS IN THE GATES OF pFETs

(71) Applicant: Taiwan Semiconductor Manufacturing Co., Ltd., Hsinchu (TW)

(72) Inventors: Hsin-Yi Lee, Hsinchu (TW); Yen-Tien Tung, Hsinchu (TW); Ji-Cheng Chen, Hsinchu (TW); Weng Chang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 676 days.

(21) Appl. No.: 17/804,971

(22) Filed: Jun. 1, 2022

(65) Prior Publication Data
US 2023/0282712 A1  Sep. 7, 2023

Related U.S. Application Data

(60) Provisional application No. 63/268,876, filed on Mar. 4, 2022.

(51) Int. Cl.
| | |
|---|---|
| *H10D 64/01* | (2025.01) |
| *H01L 21/28* | (2006.01) |
| *H10D 30/01* | (2025.01) |
| *H10D 30/67* | (2025.01) |
| *H10D 84/83* | (2025.01) |

(52) U.S. Cl.
CPC ....... *H10D 64/01* (2025.01); *H01L 21/28088* (2013.01); *H10D 30/031* (2025.01); *H10D 30/6739* (2025.01); *H10D 64/017* (2025.01); *H10D 84/83* (2025.01); *H10D 30/6757* (2025.01)

(58) Field of Classification Search
CPC .......................... H10D 64/01; H10D 30/6739
See application file for complete search history.

(56) References Cited

U.S. PATENT DOCUMENTS

| | | | |
|---|---|---|---|
| 10,340,358 B2 | 7/2019 | Suh et al. | |
| 10,468,258 B1 * | 11/2019 | Lin | H01L 21/28185 |
| 10,700,064 B1 | 6/2020 | Zhang et al. | |

(Continued)

FOREIGN PATENT DOCUMENTS

| | | |
|---|---|---|
| CN | 112420831 A | 2/2021 |
| KR | 20160007338 A | 1/2016 |

(Continued)

*Primary Examiner* — Errol V Fernandes
(74) *Attorney, Agent, or Firm* — Slater Matsil, LLP

(57) ABSTRACT

A method includes forming a dummy gate stack over a semiconductor region, forming a source/drain region on a side of the dummy gate stack, removing the dummy gate stack to form a trench, with the semiconductor region being exposed to the trench, forming a gate dielectric layer extending into the trench, and depositing a work-function tuning layer on the gate dielectric layer. The work-function tuning layer comprises aluminum and carbon. The method further includes depositing a p-type work-function layer over the work-function tuning layer, and performing a planarization process to remove excess portions of the p-type work-function layer, the work-function tuning layer, and the gate dielectric layer to form a gate stack.

20 Claims, 28 Drawing Sheets

(56) References Cited

U.S. PATENT DOCUMENTS

| | | | |
|---|---|---|---|
| 11,018,232 B2 | 5/2021 | Lin et al. | |
| 11,799,018 B2 | 10/2023 | Zhou | |
| 11,855,214 B2 | 12/2023 | Peng et al. | |
| 2020/0126789 A1* | 4/2020 | Cheng | H01L 21/28185 |
| 2021/0126018 A1 | 4/2021 | Zhang et al. | |

FOREIGN PATENT DOCUMENTS

| | | |
|---|---|---|
| KR | 20190028061 A | 3/2019 |
| KR | 20200014235 A | 2/2020 |
| KR | 20200037106 A | 4/2020 |
| TW | 201926472 A | 7/2019 |
| TW | 202125828 A | 7/2021 |

* cited by examiner

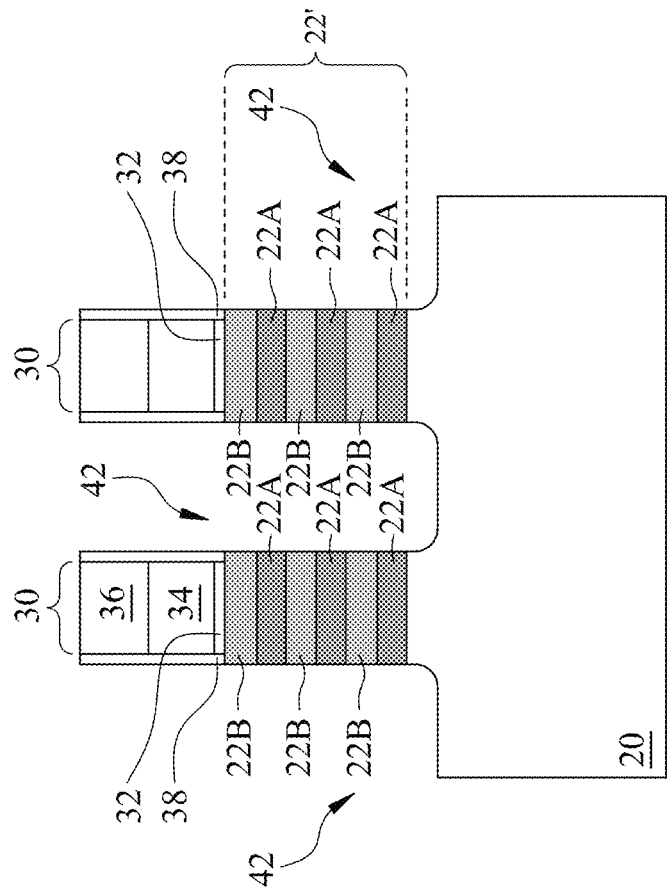
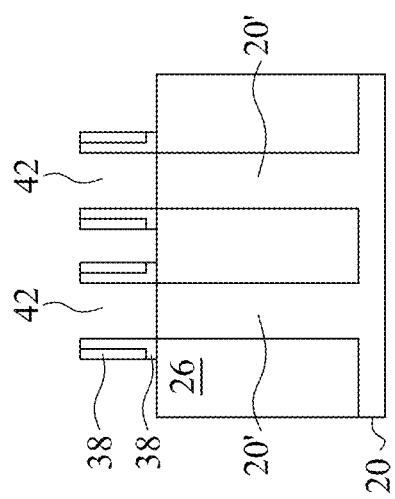
Fig. 6B
Fig. 6A

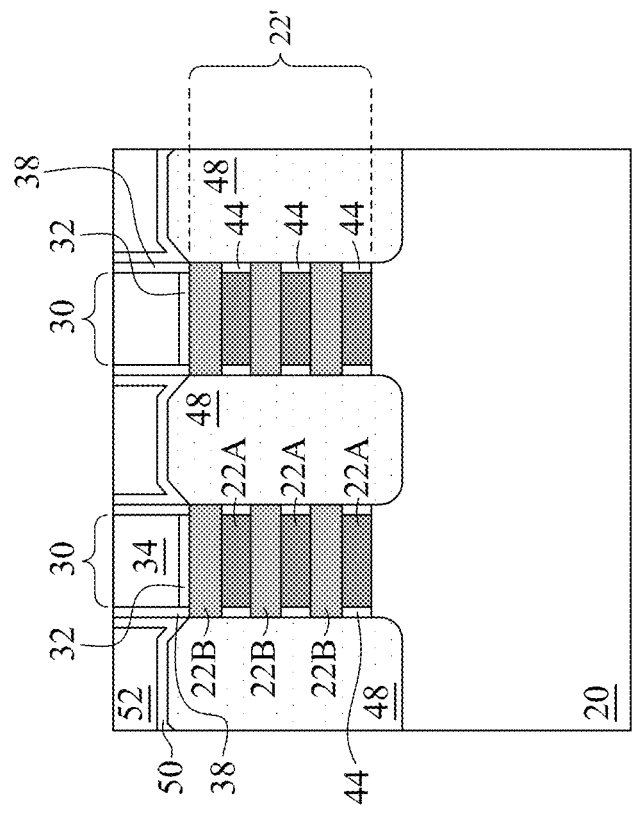
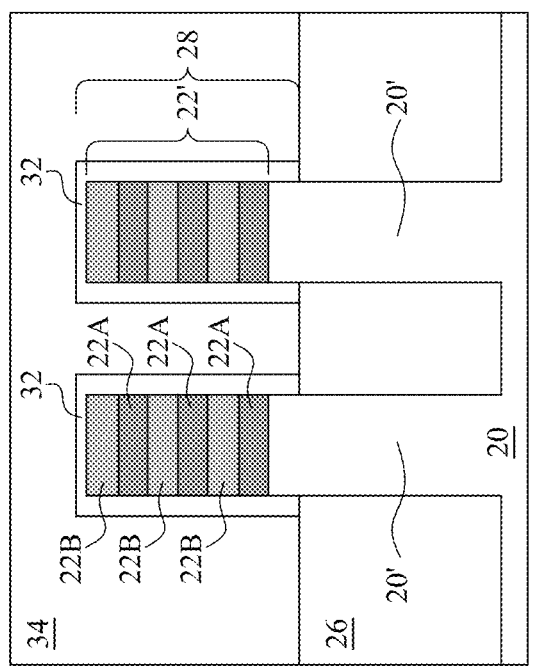
Fig. 11B
Fig. 11A

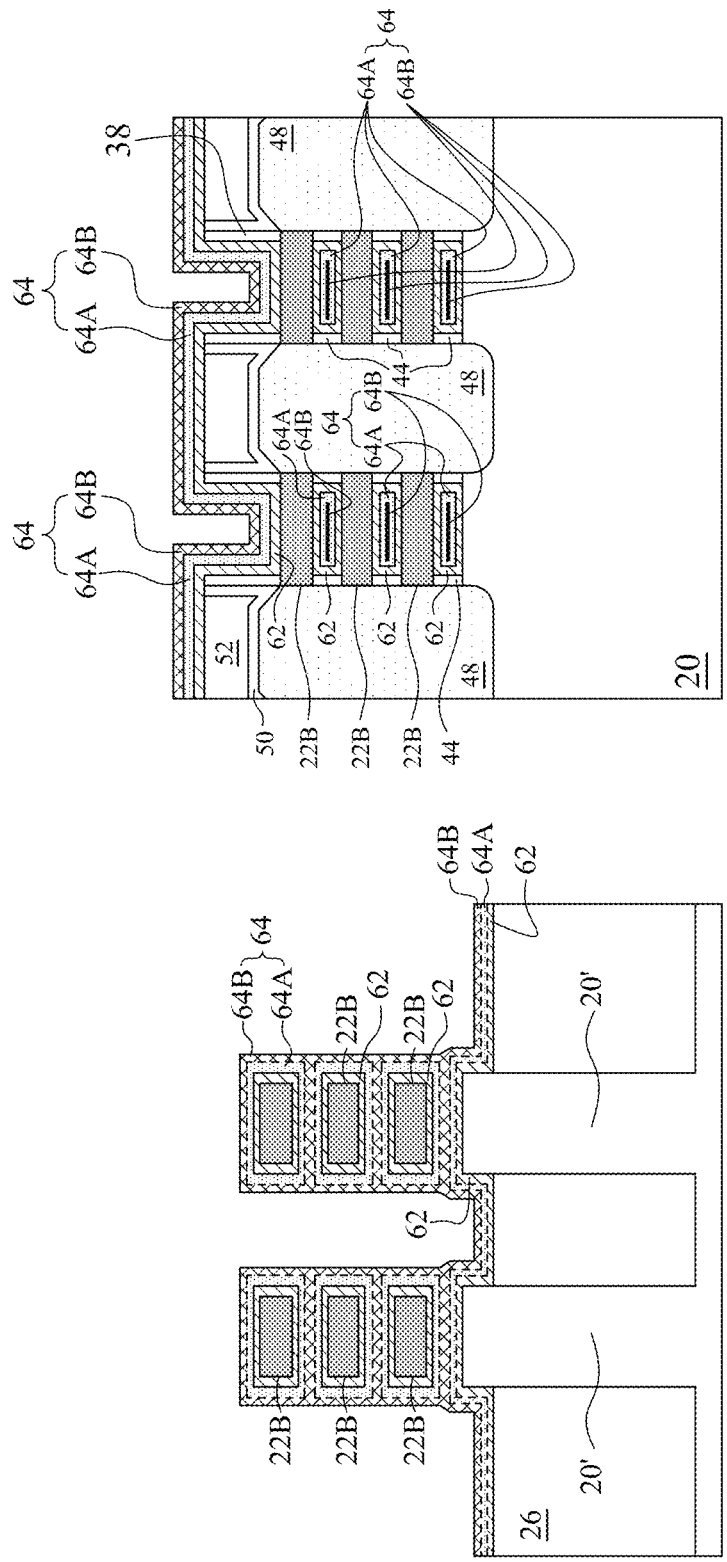

WORK-FUNCTION LAYERS IN THE GATES OF pFETs

PRIORITY CLAIM AND CROSS-REFERENCE

This application claims the benefit of the following provisionally filed U.S. Patent application: Application No. 63/268,876, filed on Mar. 4, 2022, and entitled "AlC Insertion Between HfO2 and TiN for P Work-function Tuning;" which application is hereby incorporated herein by reference.

BACKGROUND

Transistors are basic building elements in integrated circuits. In previous development of the integrated circuits, Fin Field-Effect Transistors (FinFETs) and Gate-All-Around (GAA) transistors have been formed to replace planar transistors. In the formation of FinFETs or GAA transistors, semiconductor fins or semiconductor sheets are formed, and dummy gates are formed on the semiconductor fins/sheets. The formation of the dummy gates may include depositing a dummy layer such as a polysilicon layer, and then patterning the dummy layer as dummy gates. Gate spacers are formed on the sidewalls of the dummy gate stacks. The dummy gate stacks are then removed to form trenches between the gate spacers. Replacement gates are then formed in the trenches.

When forming the replacement gates, different materials are selected for the formation of n-type transistors and p-type transistors. For example, n-type transistors may adopt TiAl in their replacement gates, while p-type transistors may adopt TiN in their replacement gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6A, 6B, 7A, 7B, 8A, 8B, 9A, 9B, 10A, 10B, 10C, 11A, 11B, 12A, 12B, 12C, 13A, 13B, 13C, 14A, 14B, 14C, 15A, 15B, 16A, 16B, 17A, 17B, 17C, 17D, 17E, 18A, 18B, 18C, 19A, 19B, and 19C illustrate various views of intermediate stages in the formation of a Gate All-Around (GAA) transistor in accordance with some embodiments.

DETAILED DESCRIPTION

Figure 1:
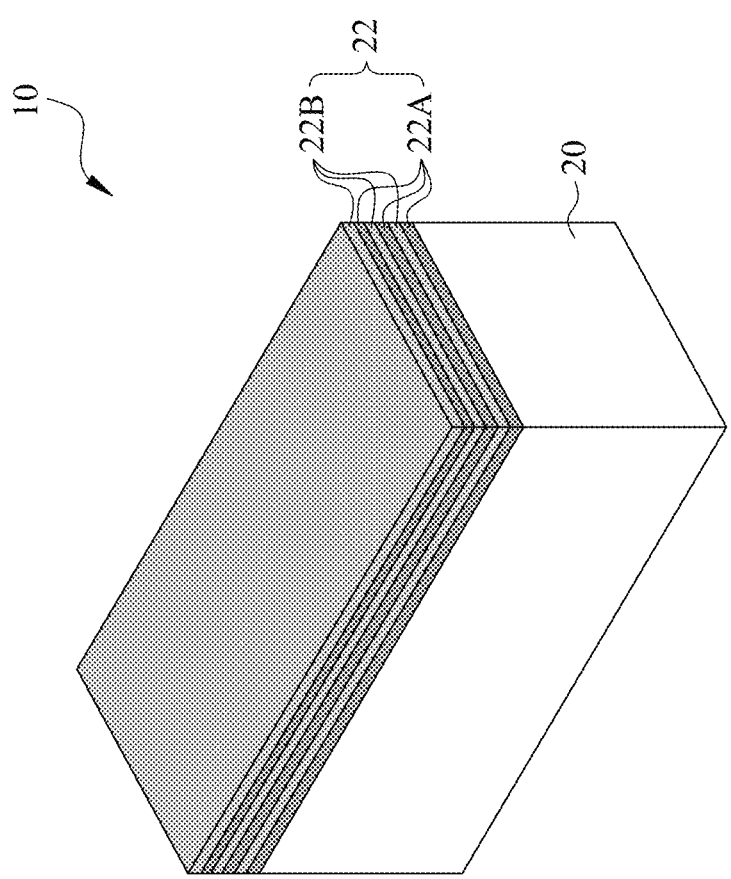

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming replacement gate stacks by inserting an aluminum-and-carbon containing work-function layer is provided. In accordance with some embodiments, a dummy gate stack is formed on semiconductor nanostructures, and is then removed, hence revealing semiconductor nanostructures. A gate dielectric including an interfacial layer and a high-k dielectric layer is formed on the semiconductor nanostructures. A layer comprising aluminum and/or carbon is deposited on the high-k dielectric layer as a part of the work-function layer, followed by forming a p-type work-function layer. By inserting the aluminum-and-carbon containing work-function layer before depositing another work-function layer, the overall work function of the work-function layer is increased. In the description of the present disclosure, a GAA transistor is discussed to explain the concept of the present disclosure. The embodiments of the present disclosure may also be applied to other types of transistors such FinFETs, planar transistors, and the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 22:
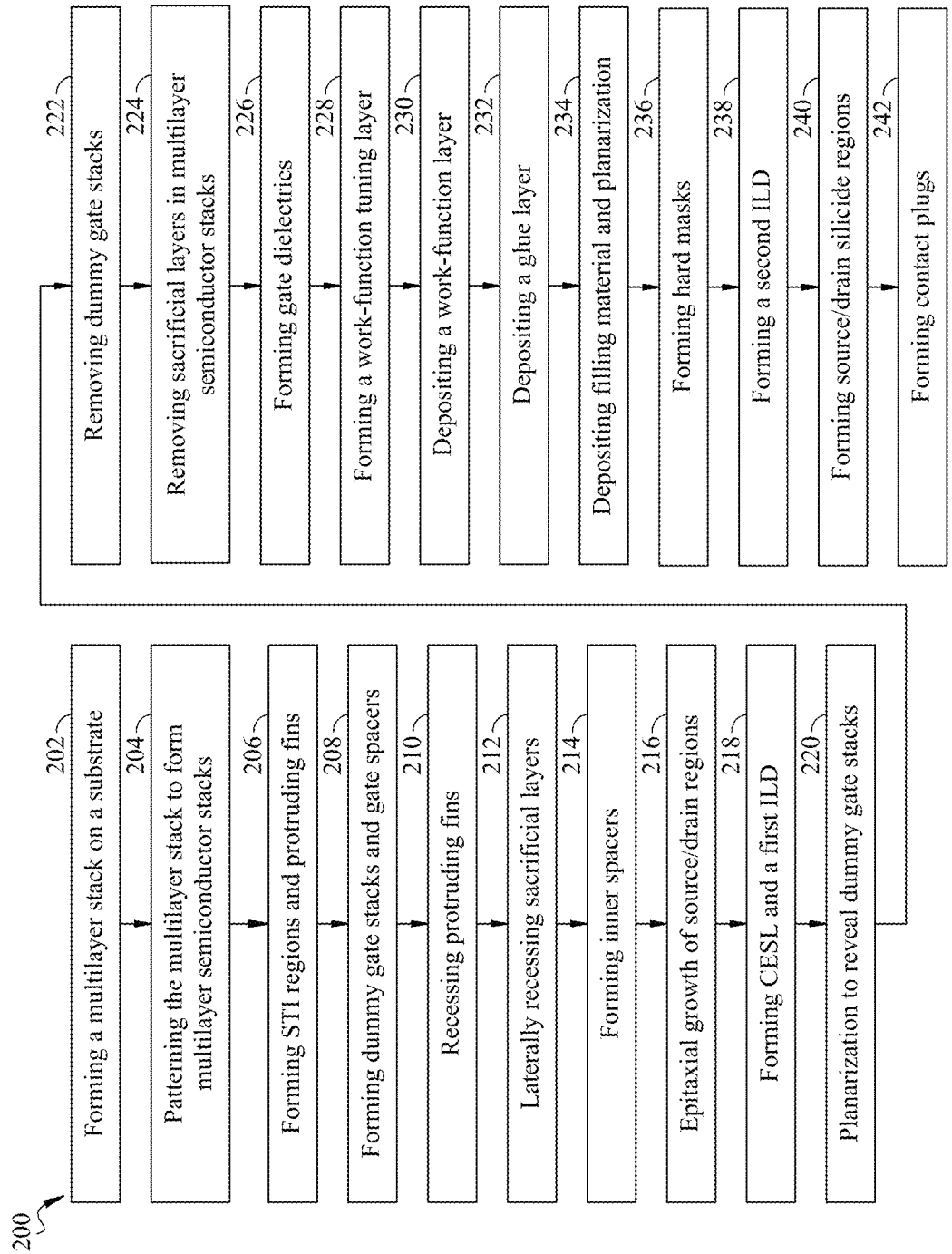
FIG. 22 illustrates a process flow for forming a GAA transistor in accordance with some embodiments.

FIGS. 1-4, 5A, 5B, 6A, 6B, 7A, 7B, 8A, 8B, 9A, 9B, 10A, 10B, 10C, 11A, 11B, 12A, 12B, 12C, 13A, 13B, 13C, 14A, 14B, 14C, 15A, 15B, 16A, 16B, 17A, 17B, 17C, 17D, 17E, 18A, 18B, 18C, 19A, 19B, and 19C illustrate various views of intermediate stages in the formation of a GAA transistor in accordance with some embodiments of the present disclosure. The corresponding processes are also reflected schematically in the process flow 200 as shown in FIG. 22.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of deposition processes for depositing alternating materials. The respective process is illustrated as process 202 in the process flow 200 shown in FIG. 22. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
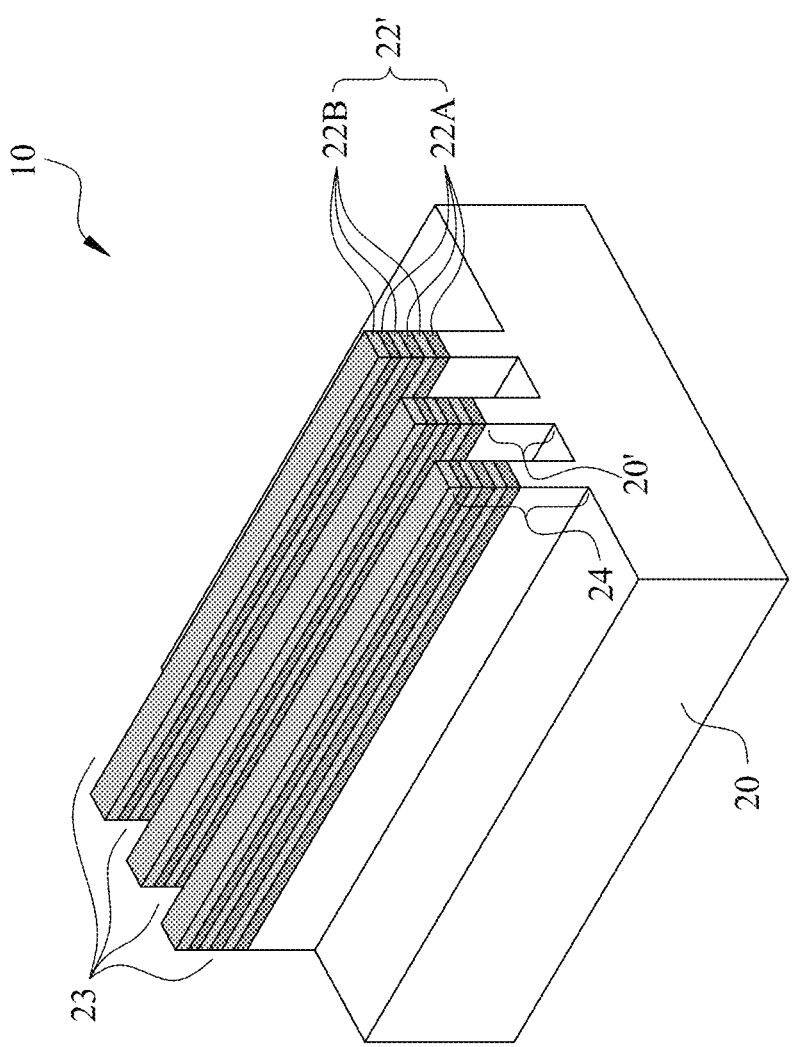

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 22. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
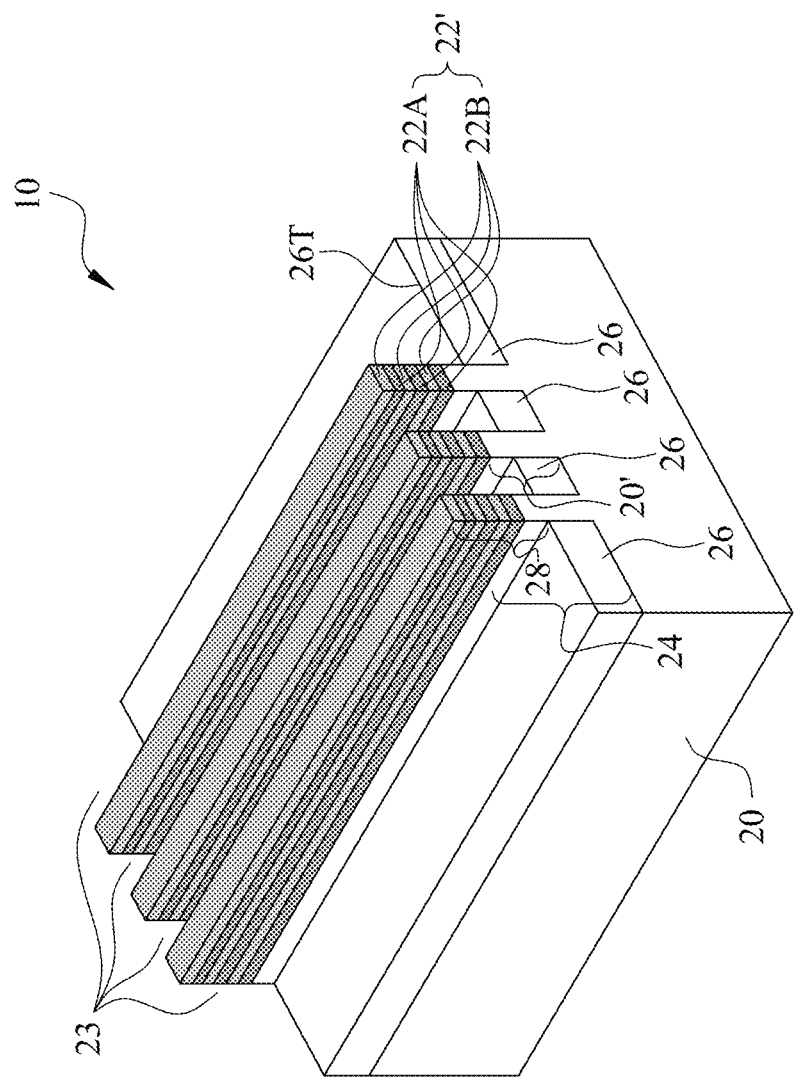

FIG. 3 illustrates the formation of isolation regions 26, which are also referred to as Shallow Trench Isolation (STI) regions throughout the description. The respective process is illustrated as process 206 in the process flow 200 shown in FIG. 22. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
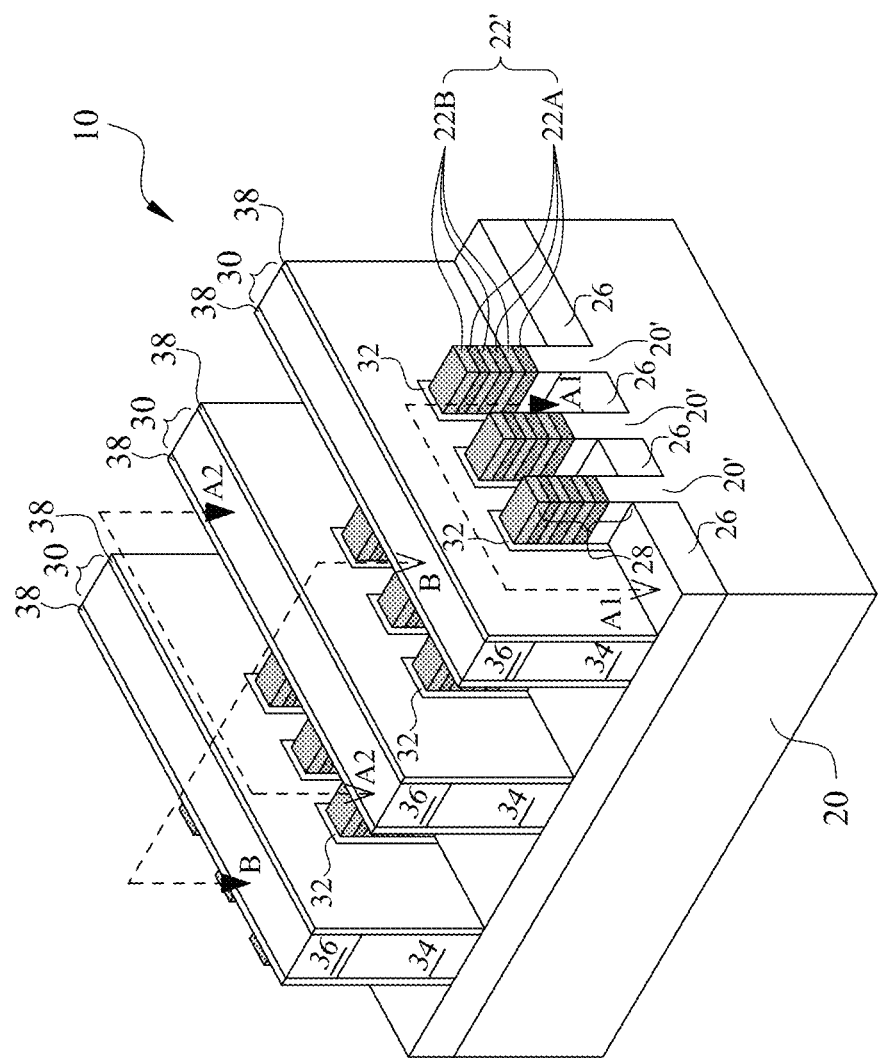

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 22. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a pattering process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 5B:
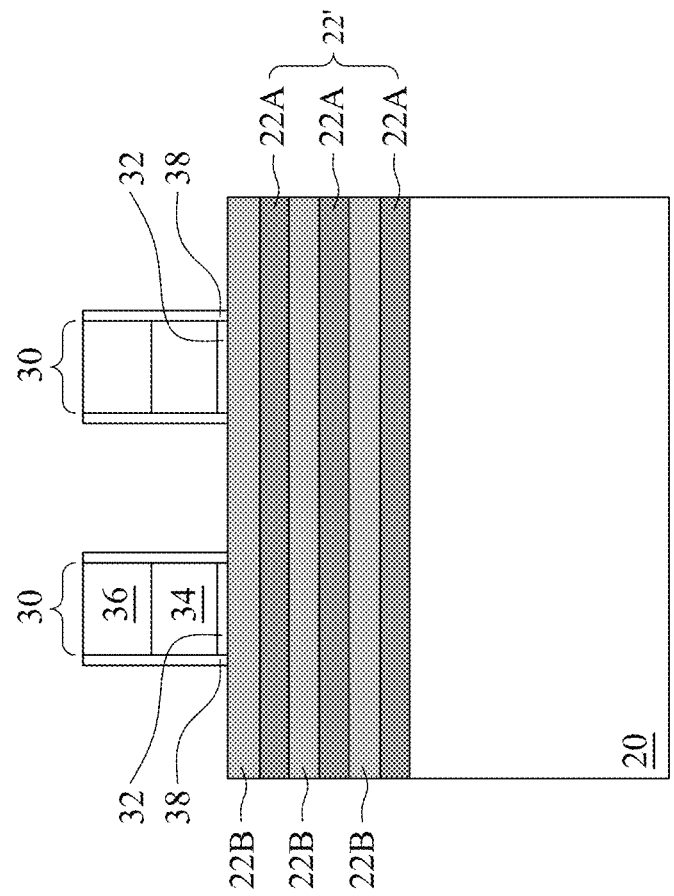
Figure 5A:
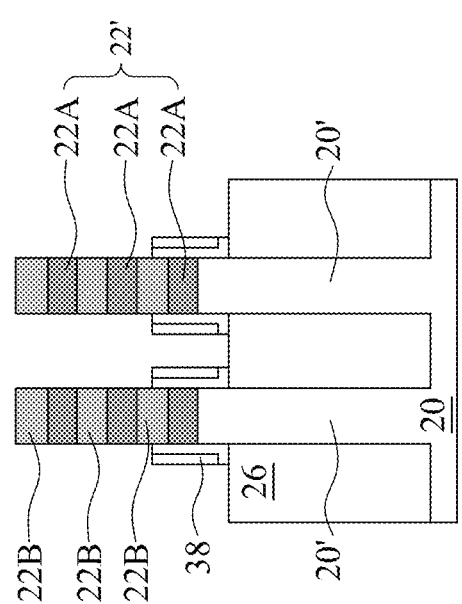

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by dummy gate stacks 30 and gate spacers 38, and is perpendicular to the gate-length direction. Fin spacers 38, which are on the sidewalls of protruding fins 28, are also illustrated. FIG. 5B illustrates the reference cross-section B-B in FIG. 4, which reference cross-section is parallel to the lengthwise directions of protruding fins 28.

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 22. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Figure 7B:
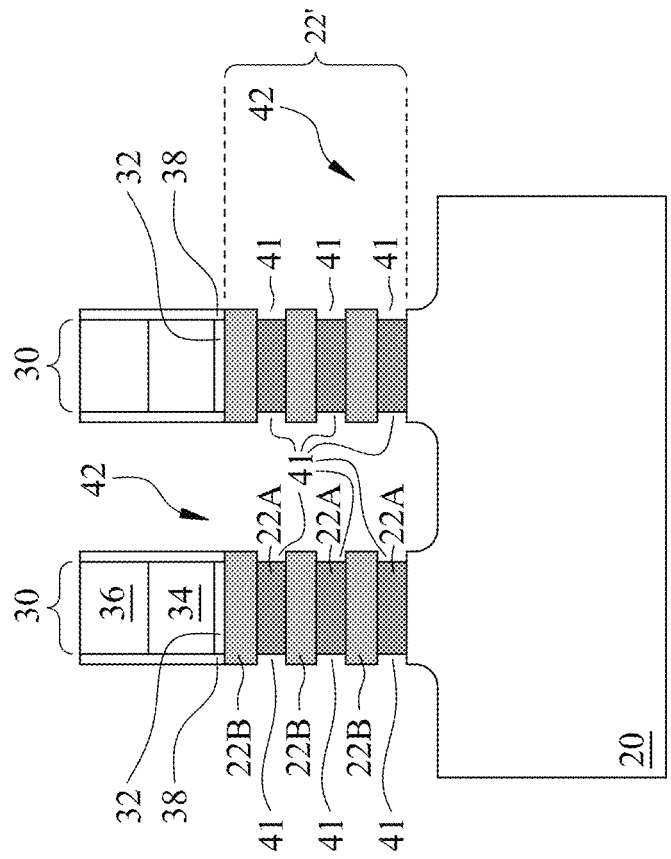
Figure 7A:
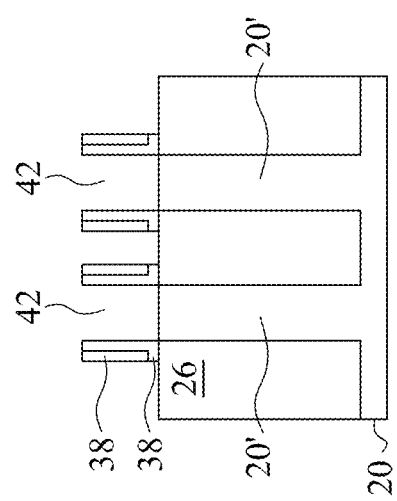

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 shown in FIG. 22. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, or the like, and may be performed using any suitable process temperatures (for example, between about 400° C. and about 600° C.) and a suitable process time (for example, between about 100 seconds and about 1,000 seconds). In accordance with alternative embodiments, the lateral recessing of sacrificial semiconductor layers 22A is performed through an isotropic dry etching process or a combination of a dry etching process and a wet etching process.

Figure 8B:
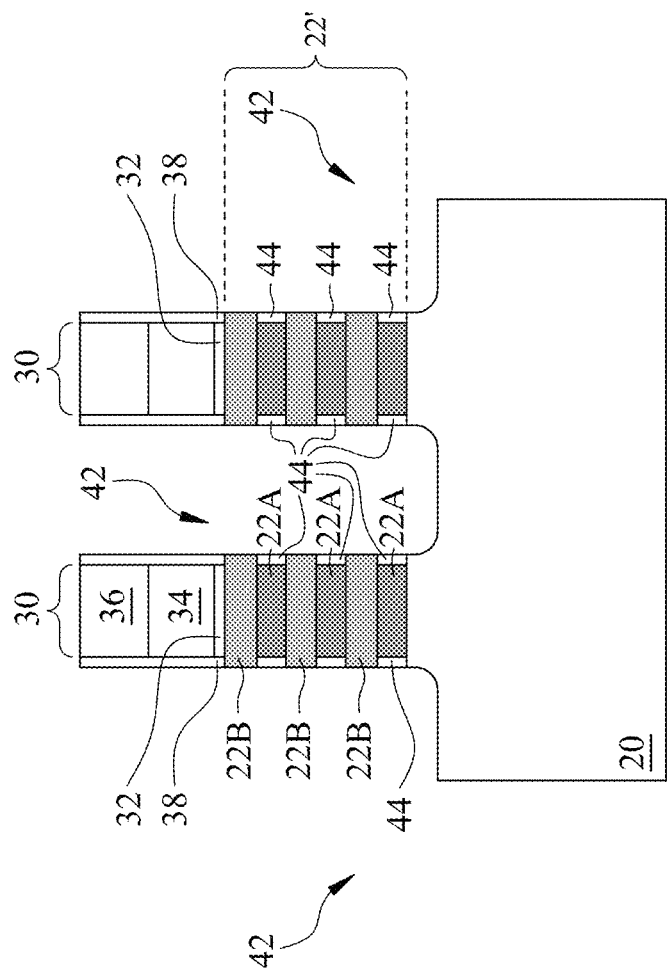
Figure 8A:
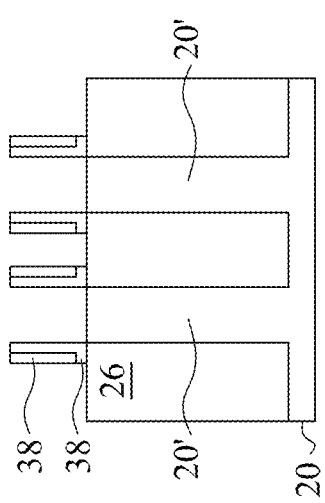

FIGS. 8A and 8B illustrate the formation of inner spacers 44. The respective process is illustrated as process 214 in the process flow 200 shown in FIG. 22. The formation process incudes depositing a spacer layer extending into recesses 41, and performing an etching process to remove the portions of the spacer layer outside of recesses 41, thus leaving inner spacers 44 in recesses 41. Inner spacers 44 may be formed of or comprise SiOCN, SiON, SiOC, SiCN, or the like. Inner spacers 44 may also be porous so that they have a lower-k value lower than, for example, about 3.5. In accordance with some embodiments, the etching of the spacer layer may be performed through a wet etching process, in which the etching chemical may include $H_2SO_4$, diluted HF, ammonia solution ($NH_4OH$, ammonia in water), or the like, or combinations thereof.

Figure 9B:
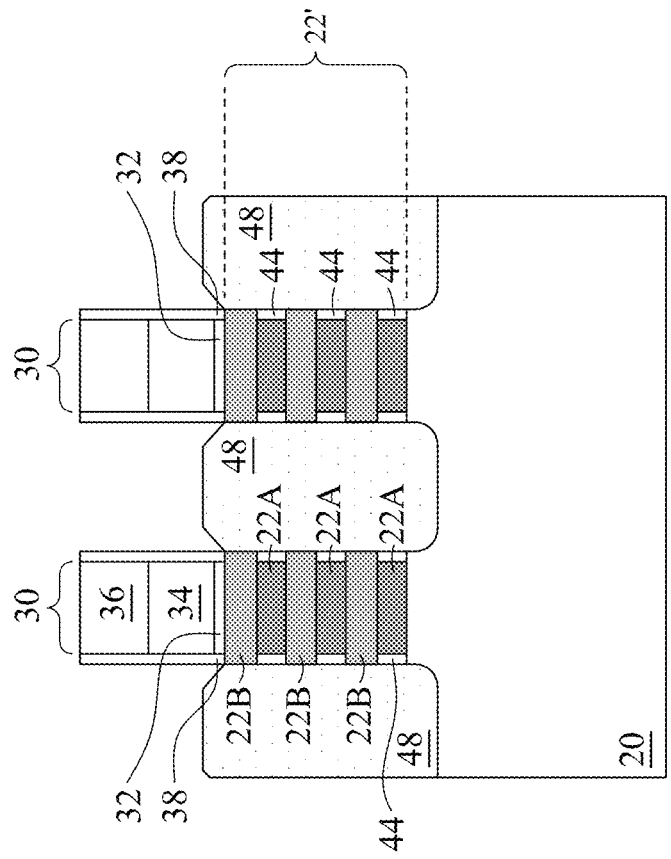
Figure 9A:
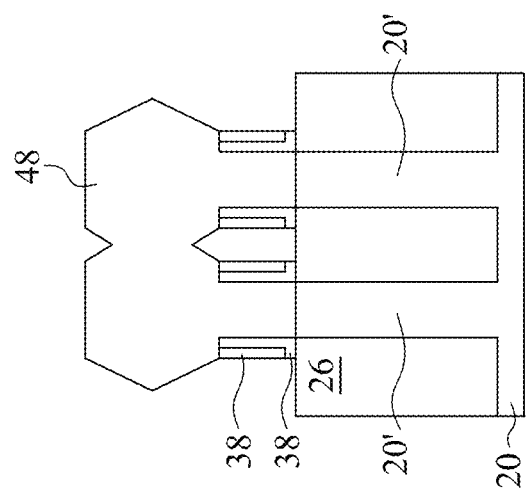

Referring to FIGS. 9A and 9B, epitaxial source/drain regions 48 are formed in recesses 42. The respective process is illustrated as process 216 in the process flow 200 shown in FIG. 22. In accordance with some embodiments, the source/drain regions 48 may exert stress on the nanostructures 22B, which are used as the channels of the corresponding GAA transistors, thereby improving performance. In accordance with some embodiments, the corresponding transistor is a p-type transistor, and epitaxial source/drain regions 48 are accordingly formed as p-type by doping a p-type dopant. For example, silicon germanium boron (SiGeB), silicon boron (SiB), or the like may be grown to form p-type epitaxial source/drain regions 48. After recesses 42 are filled with epitaxy regions 48, the further growth of epitaxy regions 48 may also cause neighboring epitaxy regions 48 to merge with each other.

The subsequent figure numbers in FIGS. 10A, 10B, and 10C through FIGS. 19A, 19B, and 19C may have the corresponding numbers followed by letter A, B, or C. Unless specified otherwise, the letter A indicates that the corresponding figure shows a cross-section same as the cross-section A2-A2 in FIG. 4, the letter B indicates that the corresponding figure shows a reference cross-section same as the reference cross-section B-B in FIG. 4, and letter C indicates the corresponding figure (except FIGS. 12C, 13C, 14C, and 17C) shows a cross-section same as the cross-section A1-A1 in FIG. 4.

Figures 10A, 10B:
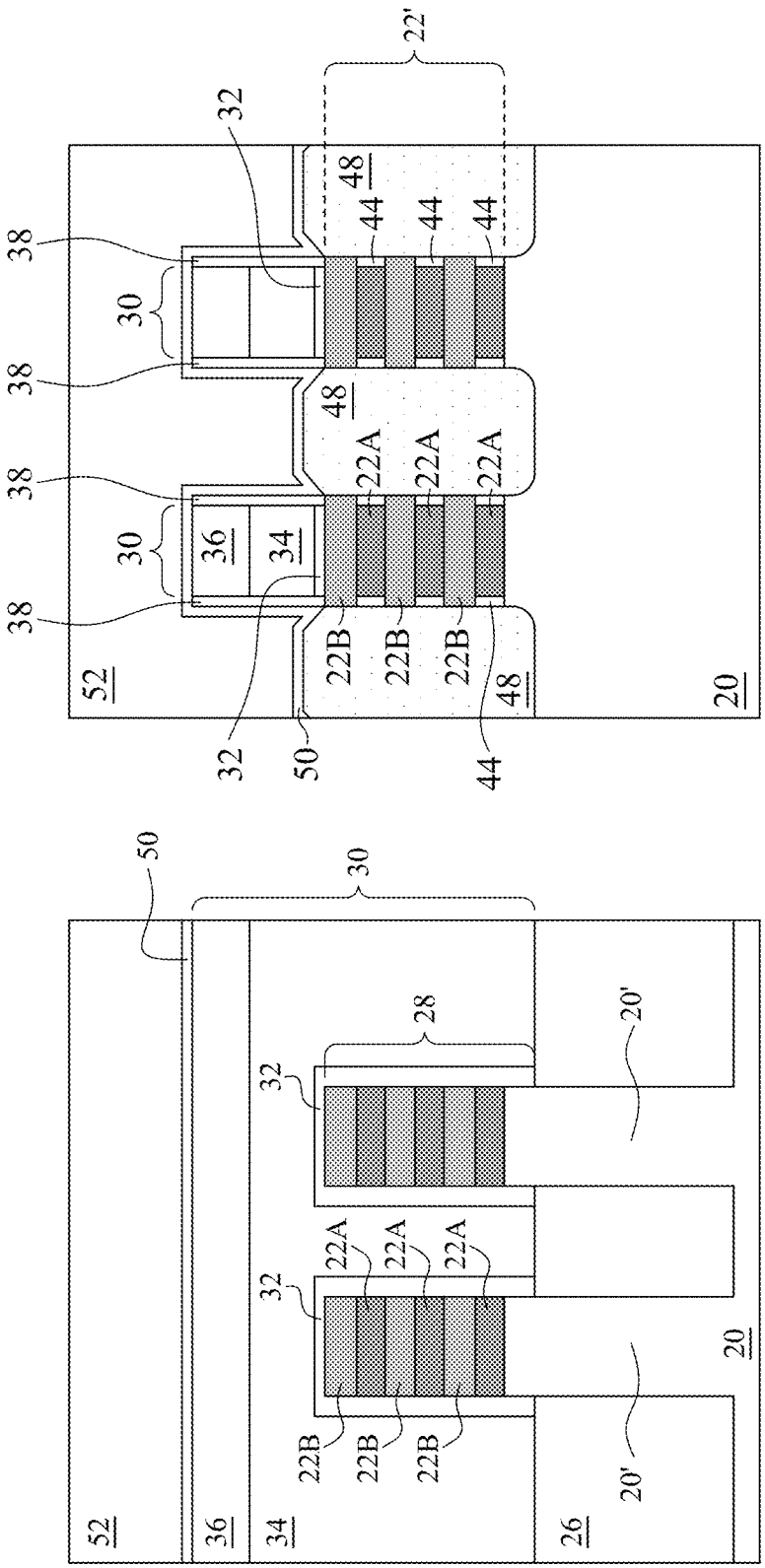
Figure 10C:
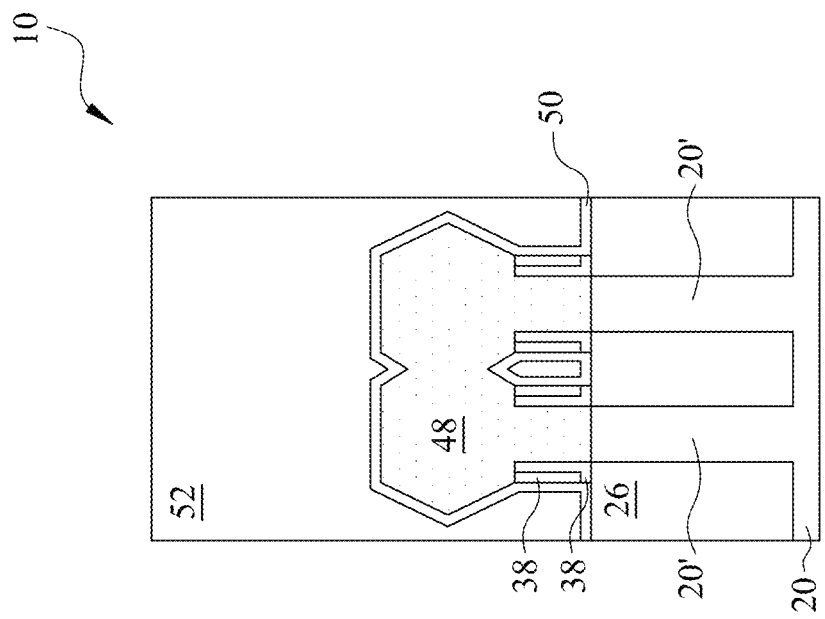

FIGS. 10A, 10B, and 10C illustrate the cross-sectional views of the structure after the formation of Contact Etch Stop Layer (CESL) 50 and Inter-Layer Dielectric (ILD) 52. The respective process is illustrated as process 218 in the process flow 200 shown in FIG. 22. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

FIGS. 11A and 11B through FIGS. 17A, 17B, 17C, 17D, and 17E illustrate the processes for forming replacement gate stacks. In FIGS. 11A and 11B, a planarization process such as a CMP process or a mechanical grinding process is performed to level the top surface of ILD 52. The respective process is illustrated as process 220 in the process flow 200 shown in FIG. 22. In accordance with some embodiments, the planarization process may remove hard masks 36 to reveal dummy gate electrodes 34, as shown in FIG. 11B. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level with each other within process variations.

Figure 12B:
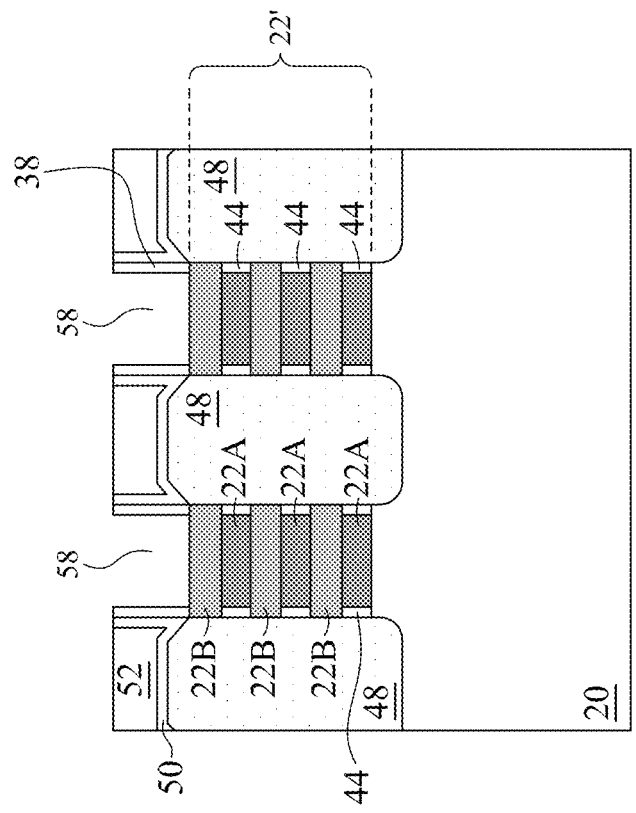
Figure 12A:
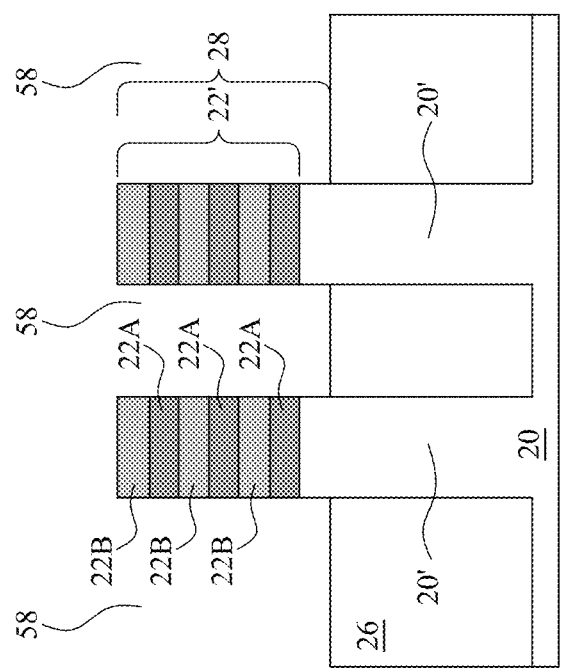
Figure 12C:
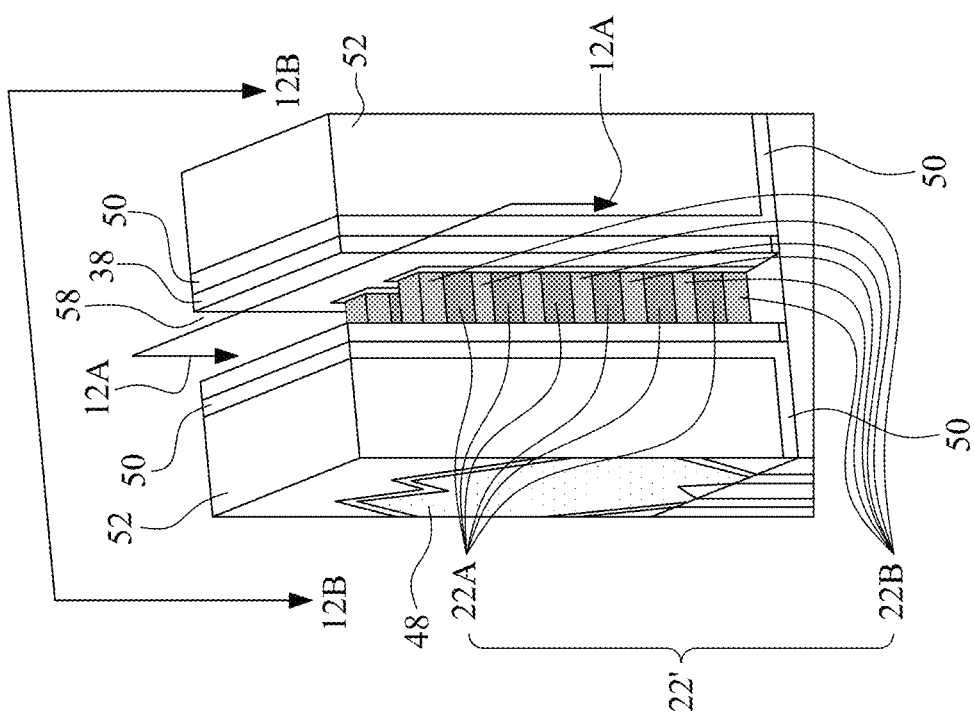

Next, dummy gate electrodes 34 (and hard masks 36, if remaining) are removed in one or more etching processes, so that recesses 58 are formed, as shown in FIGS. 12A, 12B and 12C. The respective process is illustrated as process 222 in the process flow 200 shown in FIG. 22. FIG. 12C illustrates a perspective view of the structure, and FIGS. 12A and 12B illustrate the cross-sectional views 12A-12A and 12B-12B, respectively, in FIG. 12C. The portions of the dummy gate dielectrics 32 in recesses 58 are also removed. In accordance with some embodiments, dummy gate electrodes 34 and dummy gate dielectrics 32 are removed through dry etching processes. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The corresponding portions of the multilayer stacks 22' are between neighboring pairs of the epitaxial source/drain regions 48.

Figure 13B:
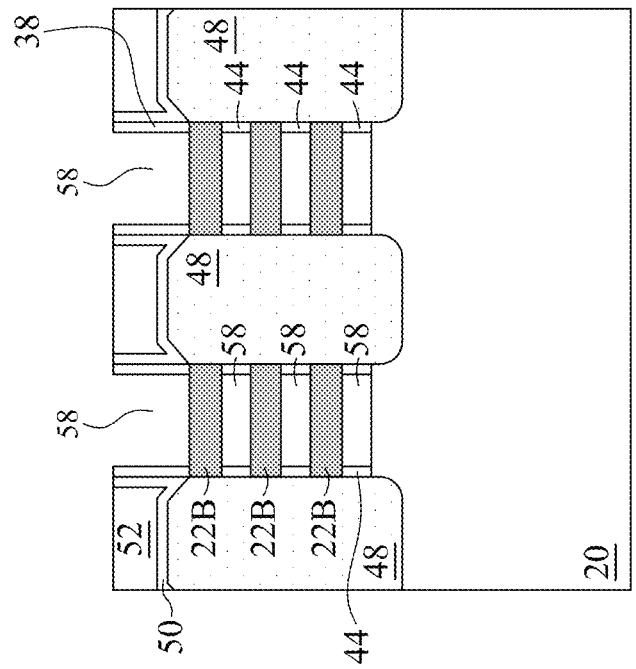
Figure 13A:
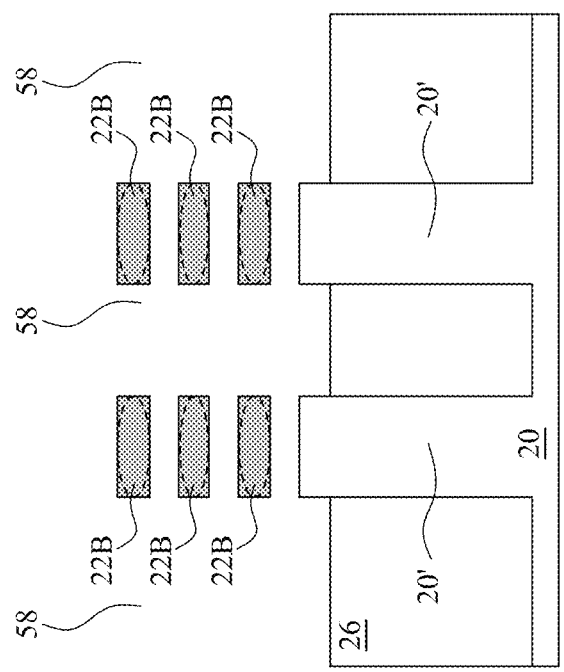
Figure 13C:
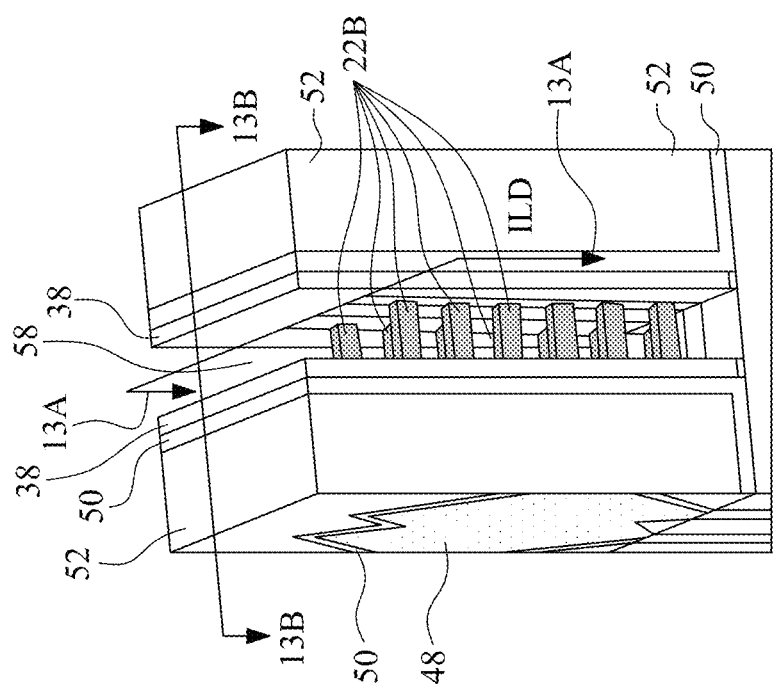

Sacrificial layers 22A are then removed to extend recesses 58 between nanostructures 22B, and the resulting structure is shown in FIGS. 13A, 13B, and 13C. The respective process is illustrated as process 224 in the process flow 200 shown in FIG. 22. FIG. 13C illustrates a perspective view of the structure, and FIGS. 13A and 13B illustrate the cross-sectional views 13A-13A and 13B-13B, respectively, in FIG. 13C. Sacrificial layers 22A may be removed by performing an isotropic etching process such as a wet etching process using etchants which are selective to the materials of sacrificial layers 22A. Nanostructures 22B, substrate 20, STI regions 26 remain relatively un-etched as compared to sacrificial layers 22A. In accordance with some embodiments in which sacrificial layers 22A include, for example, SiGe, and nanostructures 22B include, for example, Si or carbon-doped silicon, tetra methyl ammonium hydroxide (TMAH), ammonium hydroxide ($NH_4OH$), or the like may be used to remove sacrificial layers 22A. It is appreciated that although FIG. 13A and subsequent figures illustrate the cross-sections of nanostructures 22B as being rectangular, nanostructures 22B may have rounded corners, as illustrated by dashed lines in FIG. 13A.

Figure 14C:
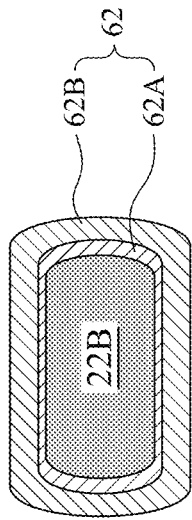
Figure 14B:
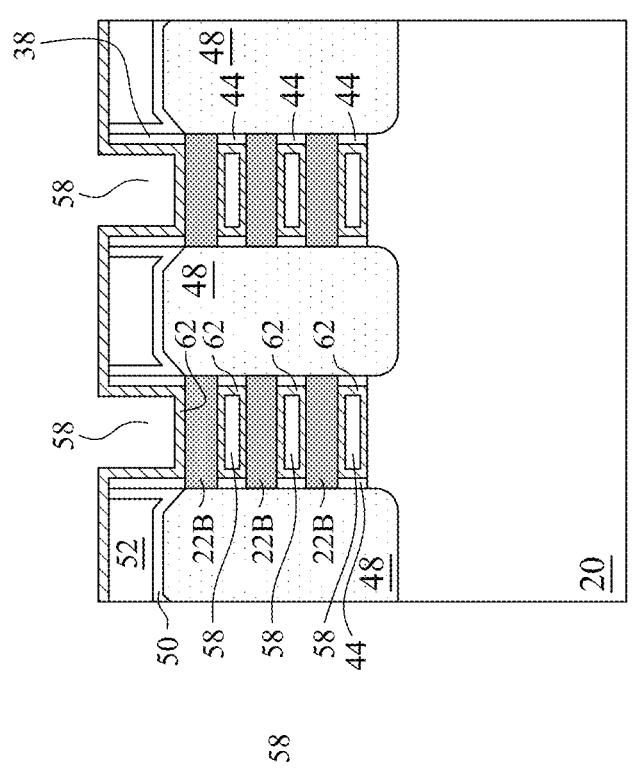
Figure 14A:
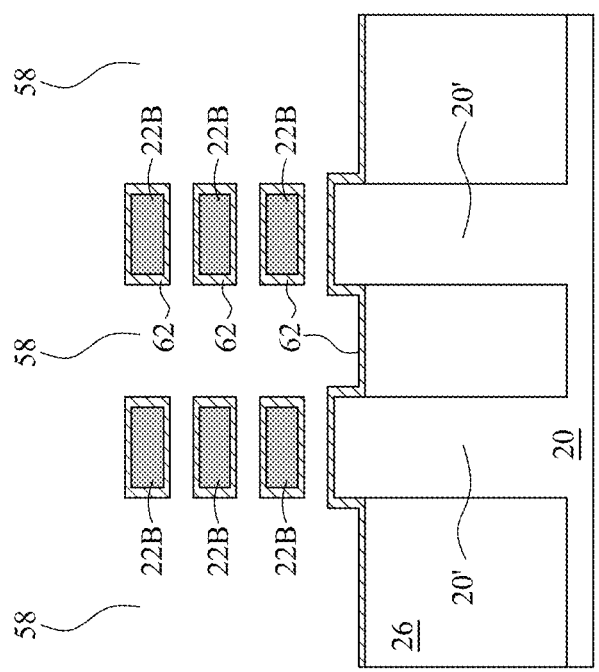

Referring to FIGS. 14A, 14B, and 14C, gate dielectrics 62 are formed. The respective process is illustrated as process 226 in the process flow 200 shown in FIG. 22. The details of an example gate dielectric 62 are shown in FIG. 14C. In accordance with some embodiments, each of gate dielectrics 62 includes interfacial layer 62A and high-k dielectric layer 62B on the interfacial layer 62A. The interfacial layer 62A may be formed of or comprises silicon oxide, which may be deposited through a conformal deposition process such as ALD or CVD. In accordance with some embodiments, the high-k dielectric layers 62B comprise one or more dielectric layers. For example, the high-k dielectric layer(s) 62B may include a metal oxide or a silicate of hafnium, aluminum, zirconium, lanthanum, manganese, barium, titanium, lead, or combinations thereof.

Referring to FIGS. 15A and 15B, work-function layer 64 is deposited, which includes work-function tuning layer 64A and work-function layer 64B over work-function tuning layer 64A. Since work-function tuning layer 64A and work-function layer 64B in combination determines the work function of the resulting gate electrode, work-function tuning layer 64A is also a part of the work-function layer of the gate electrode. On the other hand, the work-function layer 64 overall has a p-type work function, while work-function tuning layer 64A may have a n-type work function (used for tuning the overall work function of work-function layer 64), and hence is referred to as a work-function tuning layer.

In accordance with some embodiments, work-function tuning layer 64A comprises aluminum and/or carbon. For example, work-function tuning layer 64A may comprise aluminum carbon (AlC). Work-function tuning layer 64A may include other elements such as titanium and/or nitrogen. Alternatively, work-function tuning layer 64A may be free from titanium and nitrogen.

In accordance with some embodiments, the atomic-ratio of the aluminum atomic percentage to carbon atomic percentage in work-function tuning layer 64A is in the range between about 0.1 and about 4. Work-function tuning layer 64A may have an n-type work function, which is lower than mid-gap work function. The mid-gap work-function may be equal to or close to about 4.55 eV, and is in the middle between the Si conduction band (~4.1 eV) and the Si valence band (~5 eV). In accordance with some embodiments, the work function of work-function tuning layer 64A may be in the range between about 4.1 eV and about 4.45 eV.

Work-function tuning layer 64A is formed through a conformal deposition process. The respective process is illustrated as process 228 in the process flow 200 shown in FIG. 22. Work-function tuning layer 64A may be deposited through a thermal soaking process, while other processes such as ALD, CVD, or the like may be used. In accordance with some embodiments in which the thermal soaking process is used, the process gas may include both of aluminum and carbon. For example, the process gas may include Trimethylaluminium (TMA, $Al_2(CH_3)_6$), Triethylaluminium (TEAL, $Al_2(C_2H_5)_6$), or the like, or combinations thereof. The flow rate of the process gas may be in the range between about 50 sccm and about 7,000 sccm. Carrier gases such as argon, nitrogen ($N_2$), or the like may also be included. The soaking time may be in the range between about 0.1 seconds and about 1,800 seconds.

In accordance with alternative embodiments, the process for forming work-function tuning layer 64A includes a first thermal soaking process using a carbon-containing process gas, so that a carbon-containing layer is formed. The process for forming work-function tuning layer 64A further includes a second thermal soaking process using an aluminum-containing process gas, so that an aluminum-containing layer is formed. For example, the carbon-containing process gas may include Tetrakis(dimethylamido) titanium (TDMAT, $C_8H_{24}N_4Ti$) or the like. The first process gas may also include TMA and/or TEAL or their combination in addition to TDMAT. Adding TMA and/or TEAL in addition to TDMAT has the function of adjusting the atomic percentage of carbon and aluminum in the resulting work-function tuning layer 64A. Other carbon-containing process gases, which may or may not include aluminum therein, may also be used. The thickness ratio of the thickness of the carbon-containing layer to the thickness of the aluminum-containing layer may be in the range between about 0.3 and about 3. The aluminum-containing process gas used in the second thermal soaking process may include TMA, TEAL, or the combination thereof. Other aluminum-containing process gases, which may or may not include carbon therein, may also be used. The flow rate of the each of the carbon-containing process gas and the aluminum-containing process gas may be in the range between about 50 sccm and about 7,000 sccm. Carrier gases such as argon, nitrogen ($N_2$), or the like may also be included. The order of the thermal soaking process using the carbon-containing process gas and the thermal soaking process using the aluminum-containing process gas may be inversed.

The first thermal soaking process results in the deposition of a carbon-containing layer, which may or may not include aluminum, and may or may not include titanium, depending the respective process gases. The second thermal soaking process results in the deposition of an aluminum-containing layer, which may or may not include carbon, depending the respective process gases. Since the carbon-containing layer and the aluminum-containing layer are both very thin, they may be inter-diffused to form an aluminum-and-carbon containing layer. In accordance with some embodiments, there is a single thermal soaking process using the carbon-containing process gas and a single thermal soaking process using the aluminum-containing process gas. In accordance with alternative embodiments, the formation of work-function tuning layer 64A includes a plurality cycles, with each cycle including one thermal soaking process using the carbon-containing process gas and one thermal soaking process using the aluminum-containing process gas.

The wafer temperature during the deposition of work-function tuning layer 64A is controlled to be in certain range. When the wafer temperature is too low, the bonds in the process gas may not be able to break, and work-function tuning layer 64A may not be deposited. When the wafer temperature is too high, large aluminum and carbon particles will be generated, and the uniformity of work-function tuning layer 64A is adversely affected. In accordance with some embodiments, the wafer temperature is in the range between about 150° C. and about 550° C.

The chamber pressure in the chamber that is used for depositing work-function tuning layer 64A is also controlled to be in certain range. When the chamber pressure is too low or too high, work-function tuning layer 64A will not be deposited. In accordance with some embodiments, the chamber pressure is in the range between about 0.1 Torr and about 50 Torr.

In accordance with some embodiments, work-function layer 64B comprises a p-type work function material such as TiN, TaN, W, or the like, combinations thereof, and/or multi-layers thereof. The p-type work function material has a work function higher than the mid-gap work-function. Work-function layer 64B is formed in a conformal deposition process. The respective process is illustrated as process 230 in the process flow 200 shown in FIG. 22. When work-function layer 64B comprises TiN, the deposition is performed using a titanium-containing precursor and a nitrogen-containing precursor. The titanium-containing precursor may include $TiCl_4$, $TiCl_5$, or the like, or combinations thereof. The nitrogen-containing precursor may include $NH_3$. A plurality of ALD cycles may be performed, with each including pulsing and purging the titanium-containing precursor, and pulsing and purging the nitrogen-containing precursor.

In accordance with some embodiments, in which the deposition of TiN for work-function layer 64B is performed using $TiCl_4$ and $NH_3$ as process gases, and when ALD is used, the temperature of wafer 10 may be in the range between about 270° C. and about 550° C. The chamber pressure may be in the range between about 0.5 Torr and about 50 Torr.

When work-function layer 64B comprises TaN, the deposition is performed using a tantalum-containing precursor and a nitrogen-containing precursor. The tantalum-containing precursor may include $TaCl_4$, $TaCl_5$, or the like, or combinations thereof. The nitrogen-containing precursor may include $NH_3$. A plurality of ALD cycles may be performed, with each including pulsing and purging the tantalum-containing precursor, and pulsing and purging the nitrogen-containing precursor.

By inserting work-function tuning layer 64A between high-k dielectric layer 62B and work-function layer 64B, the work function of work-function layer 64 is unexpectedly increased higher than if work-function layer 64 includes work-function layer 64B and does not include work-function tuning layer 64A. Since the resulting transistor is a p-type transistor, with the increase in the work function, the threshold voltage of the resulting transistor is reduced. The reduction in the threshold voltage may be due to the formation of dipoles by the carbon atoms with high-k gate dielectric layer 62B, and may be due to the interaction of work-function tuning layer 64A with work-function layer 64B and high-k gate dielectric layer 62B. In accordance with some embodiments, by adjusting the atomic percentages of aluminum and carbon in work-function tuning layer 64A, and by selecting the thickness of work-function tuning layer 64A, the threshold voltage of the resulting transistor may be reduced by a difference greater than about 20 mV, and the difference may be in the range between about 20 mV and about 250 mV than if work-function tuning layer 64A is not formed.

Work-function tuning layer 64A may be a thin layer, and cannot be too thin or too thick. When work-function tuning layer 64A is too thin, its function of tuning the work function of the resulting work-function layer 64 is too weak, and cannot adequately reduce the threshold voltage of the resulting transistor. When work-function tuning layer 64A is too thick, since the material of work-function tuning layer 64A has an n-type work function, instead of increasing the work function of work-function layer 64, it will reduce the work function of work function layer 64. Accordingly, when work-function tuning layer 64A is too thick, instead of improving (reducing) the threshold voltage of the resulting p-type transistor, it will actually degrade (increase) the threshold voltage of the resulting p-type transistor. As a matter of fact, when the thickness of work-function tuning layer 64A increases gradually from 0 Å, the work function of work-function layer 64 will initially increases gradually, and the threshold voltage of the resulting p-type transistor will reduce gradually. When the thickness of work-function tuning layer 64A reaches a threshold value, the further increase in the thickness of work-function tuning layer 64A will cause the work function of work-function layer 64 to decrease, and the threshold voltage of the resulting p-type transistor to increase. The threshold thickness of work-function tuning layer 64A, at which the trend of threshold voltage is inversed, may be affected by various factors such as the materials and the thicknesses of the overlying and underlying materials. In accordance with some embodiments, the threshold thickness of work-function tuning layer 64A may be in the range between about 15 Å and about 25 Å. Accordingly, the thickness of work-function tuning layer 64A may be selected to be in the range between about 2 Å and about 25 Å.

Work-function layer 64 may have a total thickness in the range between about 5 Å and about 50 Å. In accordance with some embodiments, the thickness of work-function tuning layer 64A may be in the range between about 2 Å and about 25 Å. The thickness ratio of the thickness of work-function tuning layer 64A to the thickness of high-k dielectric layer 62B may be in the range between about 0.08 and about 2.5.

Figures 16A, 16B:
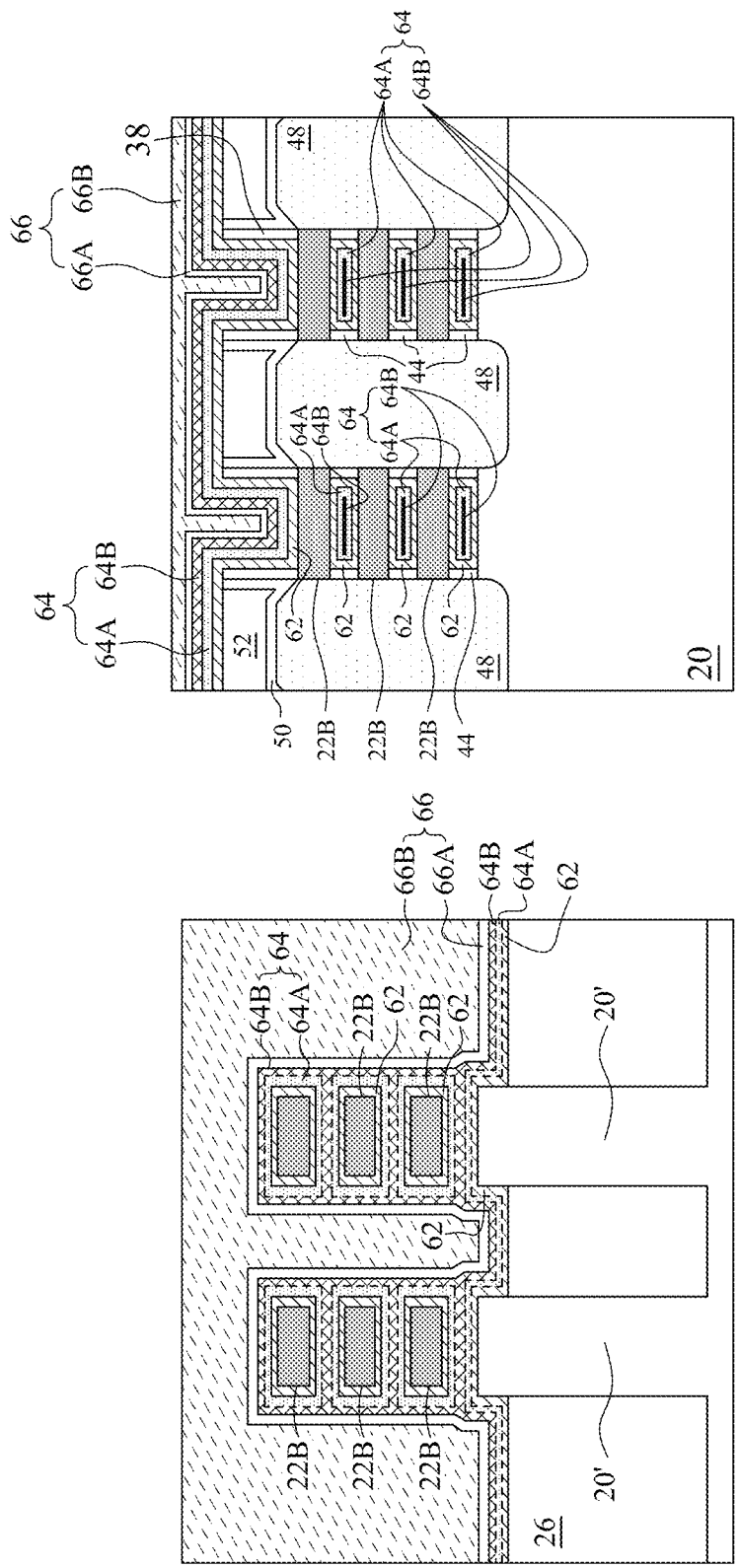

FIGS. 16A and 16B illustrate the deposition of conductive filling layers 66 to fully fill the remaining recesses 58. Conductive filling layers 66 are away from semiconductor regions (such as the nanostructure 22B) far enough, so that conductive filling layers 66 do not act as the work-function layers. The deposition of conductive filling layers 66 may include CVD, ALD, etc. In accordance with some embodiments, conductive filling layers 66 includes glue layer 66A (FIG. 16B), and filling material 66B over glue layer 66A. Glue layer 66A may be formed of or comprises TiN, TaN, WN, WCN, TiCN, or the like, or combinations thereof. The respective process is illustrated as process 232 in the process flow 200 shown in FIG. 22. Glue layer 66A may be in physical contact with work-function layer 64B. Filling material 66B may include tungsten, cobalt, aluminum, or the like.

In accordance with some embodiments in which both of work-function layer 64B and glue layer 66A comprises TiN, work-function layer 64B extends into the spaces between neighboring nanostructures 22B, while glue layer 66A is fully outside of the spaces. The formation of work-function layer 64B and glue layer 66A may be separated from each other by a vacuum break process. Work-function layer 64B and glue layer 66A may be, or may not be, distinguishable from each other. For example, the titanium atomic percentage and carbon atomic percentage of work-function layer 64B may be the same as, or different from, the corresponding titanium atomic percentage and carbon atomic percentage in glue layer 66A.

Figures 17A, 17B:
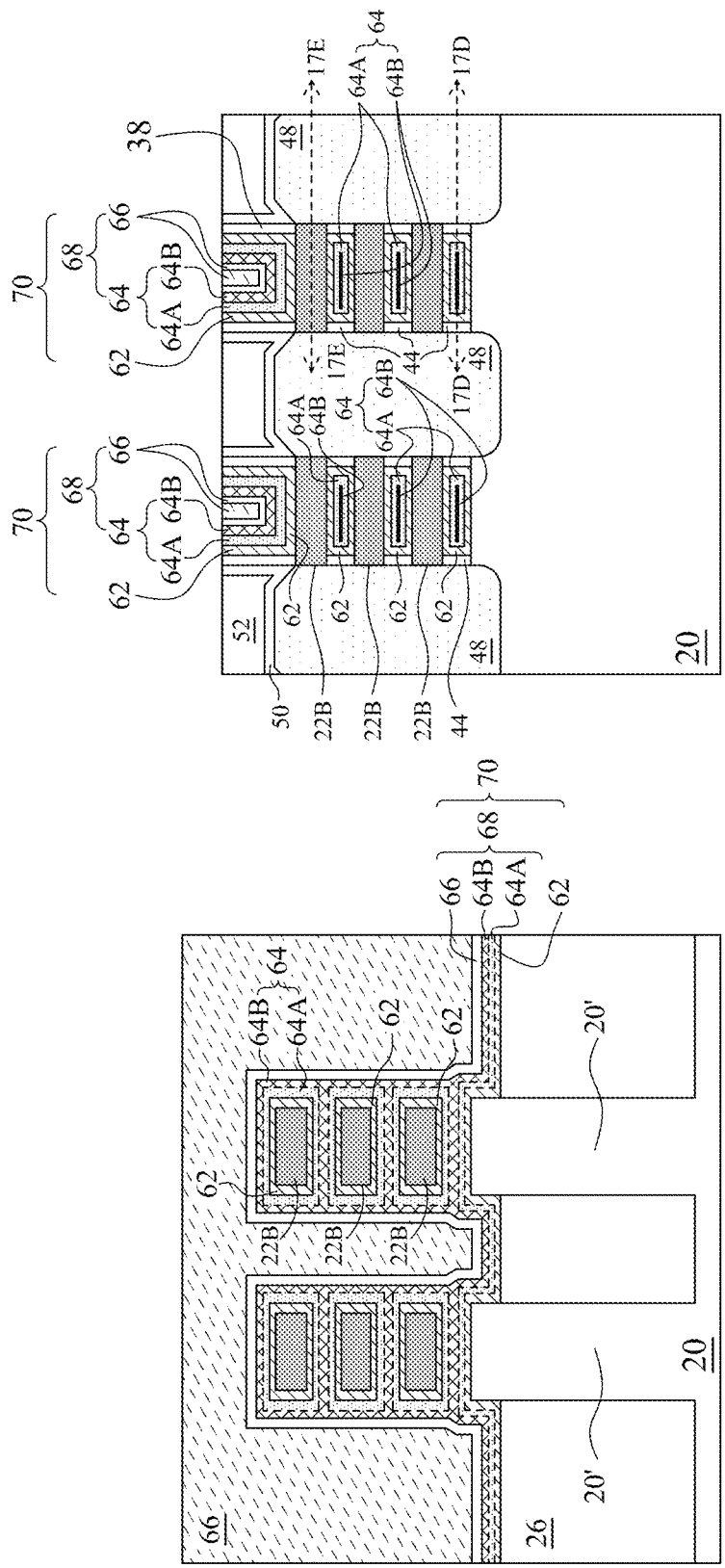

After the deposition of glue layer 66A, filing material 66B is deposited. A planarization process such as a CMP process or a mechanical grinding process is then performed to remove the excess portions of the gate dielectrics 62, work-function layer 64, and conductive filling layers 66, which excess portions are over the top surface of ILD 52. The respective process is also illustrated as process 234 in the process flow 200 shown in FIG. 22. The resulting structure is shown in FIGS. 17A and 17B. The remaining conductive filling layers 66 and work-function layer 64 are collectively referred to as gate electrodes 68. Gate electrodes 68 and gate dielectrics 62 are collectively referred to as gate stacks 70 of the resulting nano-FETs.

Figure 17D:
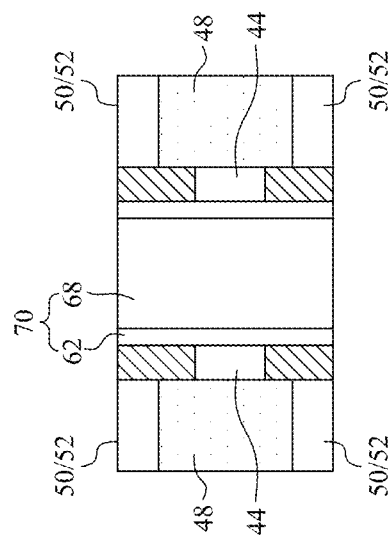
Figure 17E:
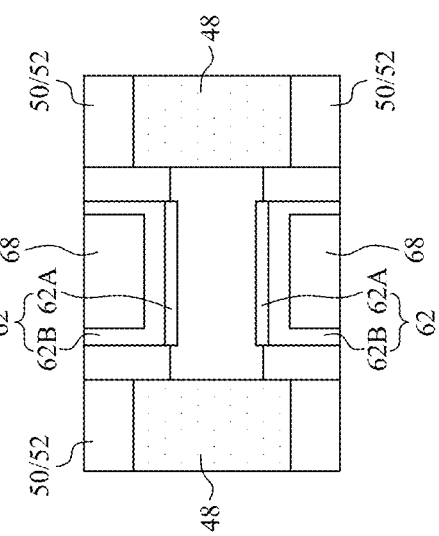
Figure 17C:
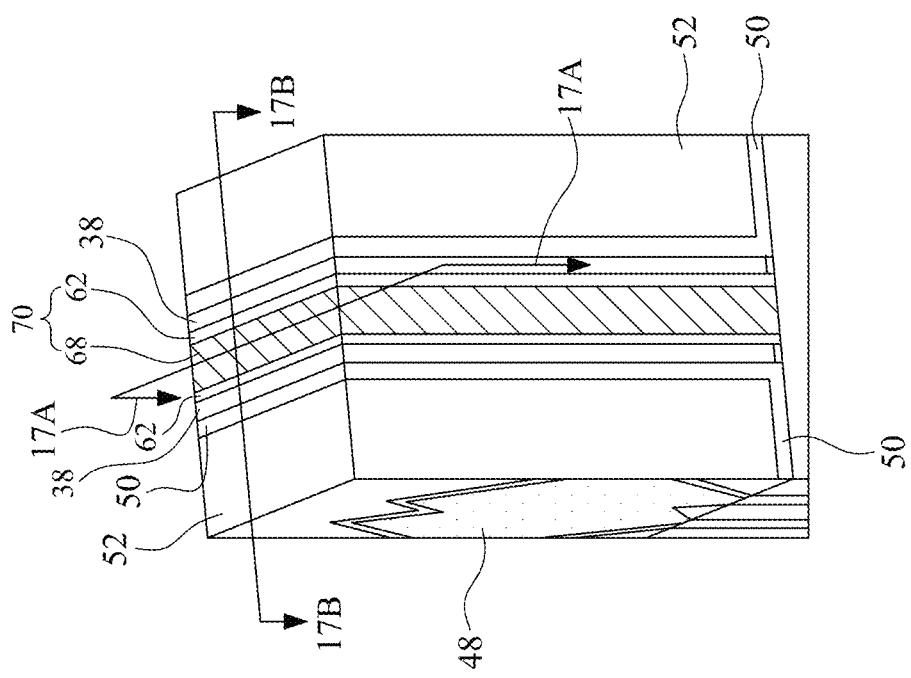

FIG. 17C illustrates a perspective view of the structure shown in FIGS. 17A and 17B, wherein the cross-sectional views shown in FIGS. 17A and 17B are obtained from the cross-sections 17A-17A and 17B-17B, respectively, in FIG. 17C. FIGS. 17D and 17E illustrate the horizontal cross-sectional views of the structure shown in FIGS. 17A, 17B, and 17C, wherein the horizontal cross-sectional views are obtained from the horizontal planes 17D-17D and 17E-17E, respectively, in FIG. 17B.

Figures 18A, 18B:
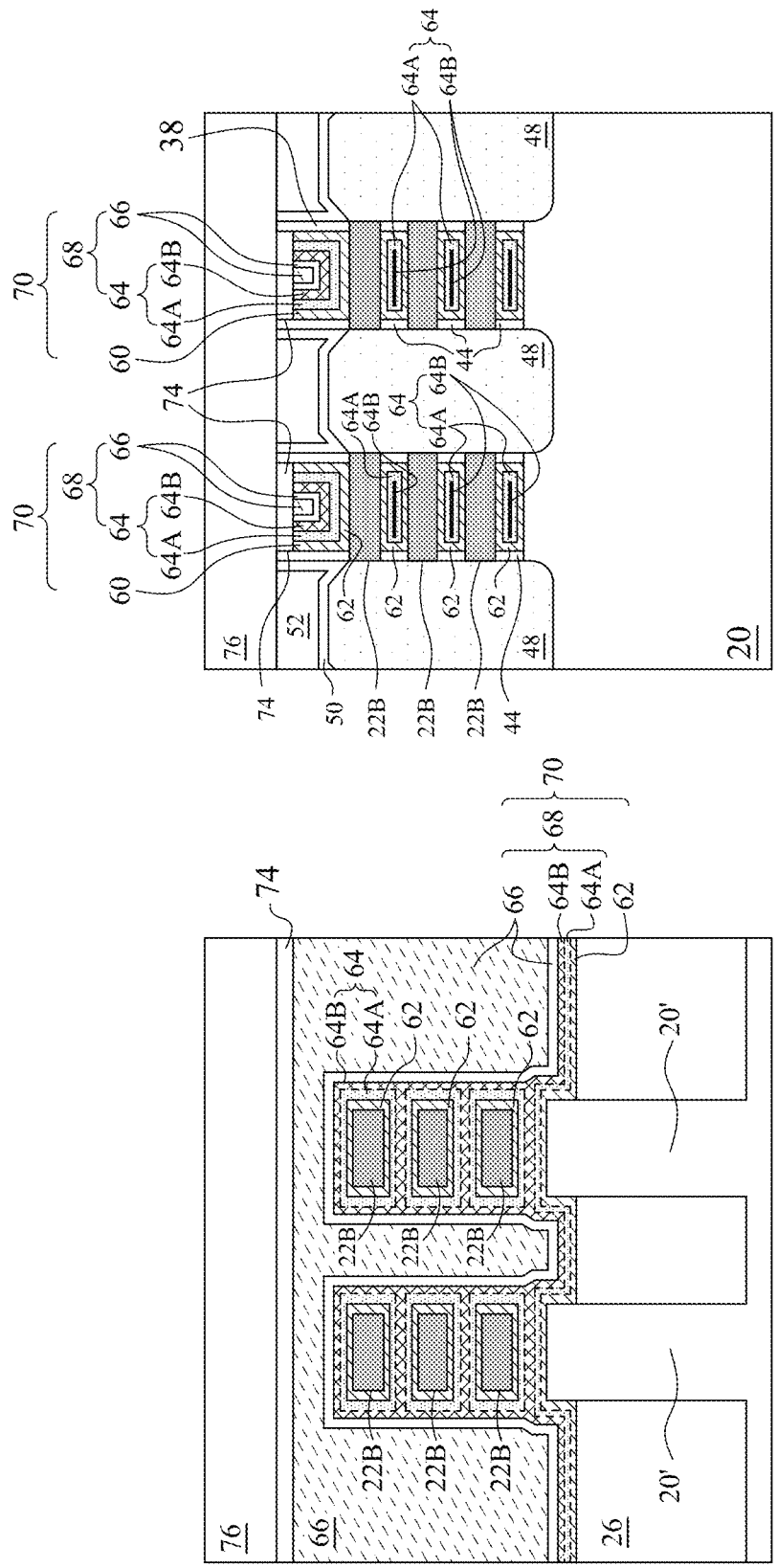
Figure 18C:
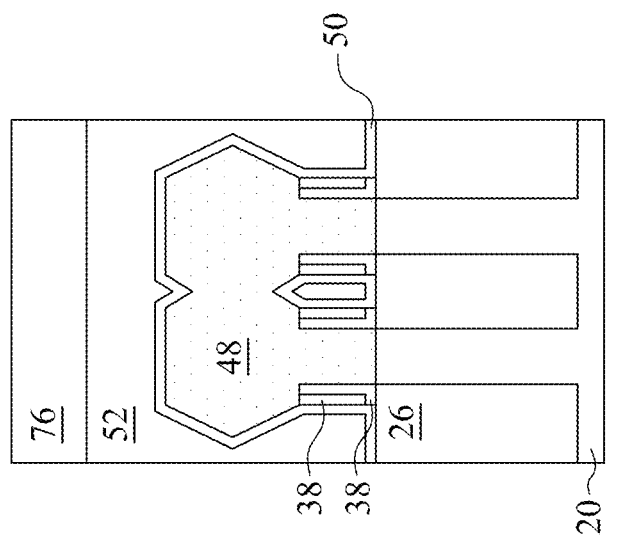

In the processes shown in FIGS. 18A, 18B, and 18C, gate stacks 70 (including gate dielectrics 62 and the corresponding overlying gate electrodes 68) are recessed, so that recesses are formed directly over gate stacks 70 and between opposing portions of gate spacers 38. A gate mask 74 comprising one or more layers of dielectric material, such as silicon nitride, silicon oxynitride, or the like, is filled in each of the recesses, followed by a planarization process to remove excess portions of the dielectric material extending over ILD 52. The respective process is illustrated as process 236 in the process flow 200 shown in FIG. 22. Subsequently formed gate contacts (such as the gate contact plugs 80, discussed below with relative to FIGS. 19A and 19B) penetrate through the gate mask 74 to contact the top surface of the recessed gate electrodes 68.

As further illustrated by FIGS. 18A, 18B, and 18C, ILD 76 is deposited over ILD 52 and over gate masks 74. The respective process is illustrated as process 238 in the process flow 200 shown in FIG. 22. An etch stop layer (not shown), may be (or may not be) deposited before the formation of ILD 76. In accordance with some embodiments, ILD 76 is formed through FCVD, CVD, PECVD, or the like. ILD 76 is formed of a dielectric material, which may be selected from silicon oxide, PSG, BSG, BPSG, USG, or the like.

Figures 19A, 19B:
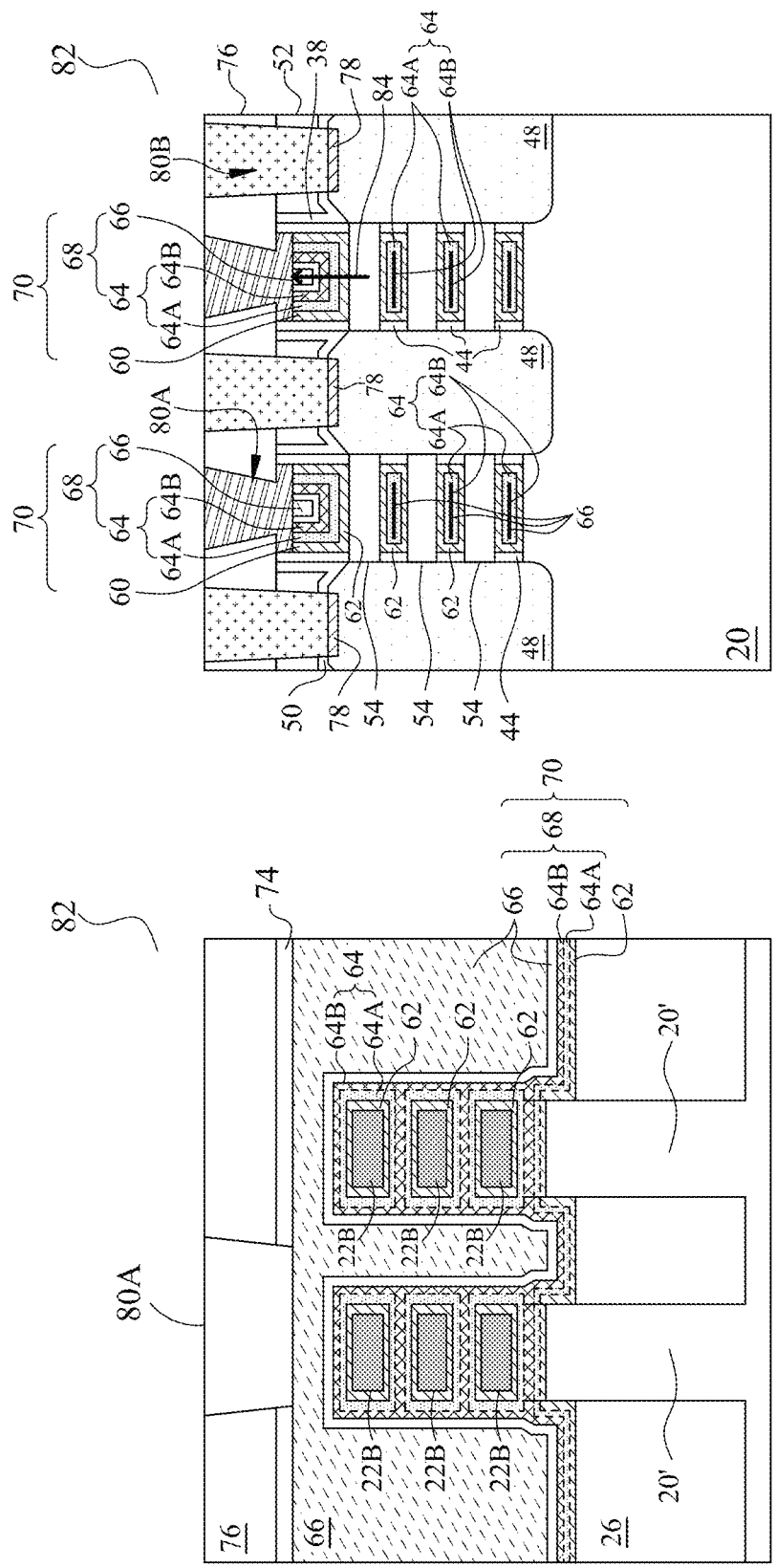
Figure 19C:
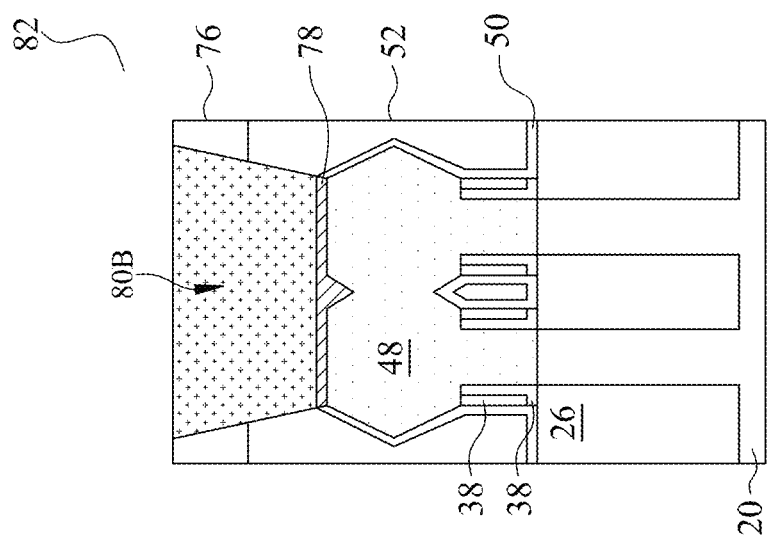

In FIGS. 19A, 19B, and 19C, ILD 76, ILD 52, CESL 50, and gate masks 74 are etched to form recesses (occupied by contact plugs 80A and 80B) exposing surfaces of the epitaxial source/drain regions 48 and/or gate stacks 70. The recesses may be formed through etching using an anisotropic etching process, such as RIE, NBE, or the like. In accordance with some embodiments, the recesses may be formed by etching-through ILD 76 and ILD 52 using a first etching process, etching-through gate masks 74 using a second etching process, and etching-through CESL 50 possibly using a third etching process. Although FIG. 19B illustrates that contact plugs 80A and 80B are in a same cross-section, in various embodiments, contact plugs 80A and 80B may be formed in different cross-sections, thereby reducing the risk of shorting with each other.

After the recesses are formed, silicide regions 78 (FIGS. 19B and 19C) are formed over the epitaxial source/drain regions 48. The respective process is illustrated as process 240 in the process flow 200 shown in FIG. 22. In accordance with some embodiments, silicide regions 78 are formed by first depositing a metal layer (not shown) capable of reacting with the semiconductor materials of the underlying epitaxial source/drain regions 48 (for example, silicon, silicon germanium, germanium) to form silicide and/or germanide regions, then performing a thermal anneal process to form silicide regions 78. The metal may include nickel, cobalt, titanium, tantalum, platinum, tungsten, or the like. The un-reacted portions of the deposited metal are then removed, for example, by an etching process.

Contact plugs 80B are then formed over silicide regions 78. Also, contact plugs 80A (may also be referred to as gate contact plugs) are also formed in the recesses, and are over and contacting gate electrodes 68. The respective processes are illustrated as process 242 in the process flow 200 shown in FIG. 22. Contact plugs 80A and 80B may each comprise one or more layers, such as a barrier layer, a diffusion layer, and a fill material. For example, in accordance with some embodiments, contact plugs 80A and 80B each includes a barrier layer and a conductive material, and are electrically coupled to the underlying conductive feature (for example, gate stacks 70 and/or silicide region 78 in the illustrated embodiment). The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP process, may be performed to remove excess material from a surface of ILD 76. Nano-FET 82, which is a p-type transistor, is thus formed.

Figure 20:
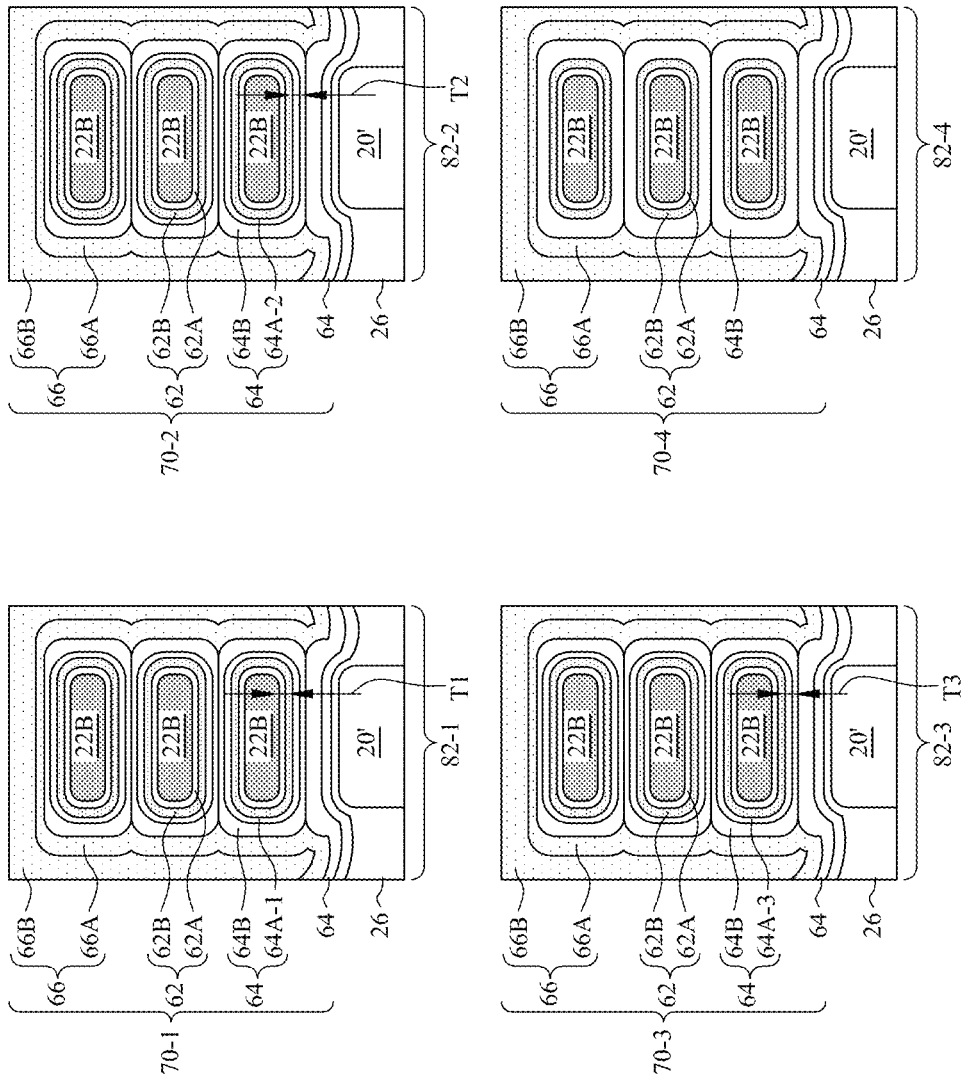
FIG. 20 illustrates the gate stacks of several transistors having different gate stacks in accordance with some embodiments.

FIG. 20 illustrates a cross-sectional view of detailed nanostructures and gate stacks of four p-type transistors 82-1, 82-2, 82-3, and 82-4, which include gate stacks 70-1, 70-2, 70-3, and 70-4, respectively. P-type transistors 82-1, 82-2, 82-3, and 82-4 have p-type source/drain regions 48, as shown in FIGS. 19B and 19C. Transistors 82-1, 82-2, 82-3, and 82-4 are formed in the same device die and on the same semiconductor substrate. In accordance with some embodiments, work-function tuning layers 64A-1, 64A-2, and 64A-3 are different from each other, while other corresponding layers in gate stacks 70-1, 70-2, and 70-3 are identical to each other (and may be formed sharing common processes). For example, work-function tuning layers 64A-1, and 64A-2, 64A-3 may have different thicknesses and/or different carbon and/or aluminum atomic percentages. Accordingly, the threshold voltages of transistors 82-1, 82-2, and 82-3 may be different from each other. In accordance with some embodiments, thicknesses T1, T2, and T3 of the respective work-function tuning layers 64A-1, and 64A-2, 64A-3 have the relationship T1<T2<T3, wherein work-function tuning layers 64A-1, 64-2, and 64-3 may have the same composition. In accordance with some embodiments, the threshold voltage of transistor 82-2 is lower than the threshold voltages of both of transistors 82-1 and 82-3. On the other hand, while with T1<T3, the threshold voltage of transistors 82-1 may be lower than, equal to, or greater than, the threshold voltage of transistors 82-3.

FIG. 20 further illustrates p-type transistor 82-4, whose gate stack 70-4 is similar to the gate stacks 70-1 and 70-2, except that no work-function tuning layer is formed. Accordingly, p-type transistor 82-4 may have a threshold voltage greater than the threshold voltages of p-type transistors 82-1 and 82-2. On the other hand, the threshold voltage of p-type transistor 82-4 may be smaller than, equal to, or greater than, the threshold voltage of p-type transistor 82-3.

Figure 21:
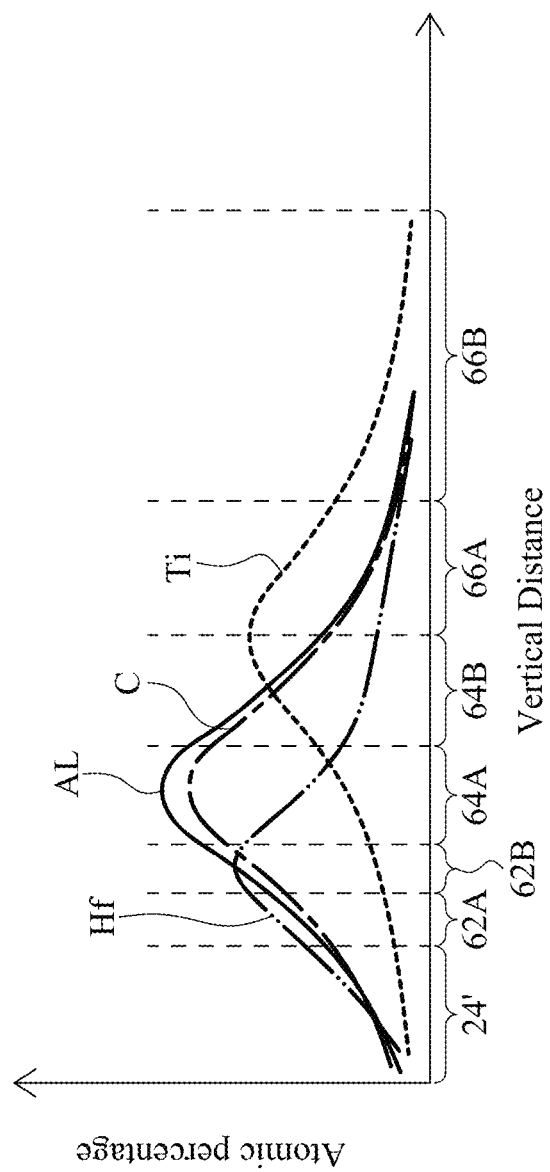
FIG. 21 illustrates the distribution of the atomic percentages of several elements in some gate stacks in accordance with some embodiments.

FIG. 21 schematically illustrates the distribution of some elements in gate stacks 70 (FIG. 19B) as functions of vertical distance from nanostructure 22B. The illustrated distribution includes the carbon atomic percentage and aluminum atomic percentage (in work-function tuning layer 64A), the titanium atomic percentage (in work-function layer 64B and glue layer 66A), and the hafnium atomic percentage (in high-k dielectric layer 62B). The X-axis represents the vertical distance in the direction of arrow 84 in FIG. 19B. The Y-axis represents the atomic percentage values. In accordance with some embodiments, although the elements in gate stack 70 diffuse away from where they are deposited, the carbon atomic percentage and/or aluminum atomic percentage may have peak values in work-function tuning layer 64A. The titanium atomic percentage has a peak value either in work-function layer 64B or in glue layer 66A, or at the interface between work-function layer 64B and glue layer 66A, assuming both of work-function layer 64B and glue layer 66A comprise titanium. The hafnium atomic percentage has a peak value in high-k dielectric layer 62B assuming high-k dielectric layer 62B comprises hafnium.

The embodiments of the present disclosure have some advantageous features. By inserting a work-function tuning layer (which may comprise aluminum and carbon) between a work-function layer and the corresponding underlying high-k dielectric layer, the threshold voltage of the resulting p-type transistor may be tuned, and may be reduced. A plurality of p-type transistors having different work functions may be formed by selectively forming or not forming the work-function tuning layer, and by tuning the thickness and the composition of the work-function tuning layer.

In accordance with some embodiments of the present disclosure, a method comprises forming a dummy gate stack over a semiconductor region; forming a source/drain region on a side of the dummy gate stack; removing the dummy gate stack to form a trench, with the semiconductor region being exposed to the trench; forming a gate dielectric layer extending into the trench; depositing a work-function tuning layer on the gate dielectric layer, wherein the work-function tuning layer comprises aluminum and carbon; depositing a p-type work-function layer over the work-function tuning layer; and performing a planarization process to remove excess portions of the p-type work-function layer, the work-function tuning layer, and the gate dielectric layer to form a gate stack. In an embodiment, the depositing the work-function tuning layer comprises a thermal soaking process using a process gas comprising both of aluminum and carbon. In an embodiment, the process gas is selected from the group consisting of Trimethylaluminium (TMA, $Al_2(CH_3)_6$), Triethylaluminium (TEAL, $Al_2(C_2H_5)_6$), and combinations thereof.

In an embodiment, the thermal soaking process is performed at a wafer temperature in a range between about 150° C. and about 550° C. In an embodiment, the depositing the work-function tuning layer comprises thermal soaking processes using a first process gas comprising aluminum, and a second process gas comprising carbon. In an embodiment, the first process gas is selected from the group consisting of Trimethylaluminium (TMA, $Al_2(CH_3)_6$), Triethylaluminium (TEAL, $Al_2(C_2H_5)_6$), and combinations thereof, and the second process gas comprises Tetrakis(dimethylamido)titanium (TDMAT, $C_8H_{24}N_4Ti$). In an embodiment, the forming the gate dielectric layer comprises depositing a high-k dielectric layer, and wherein the work-function tuning layer is in physical contact with the high-k dielectric layer.

In an embodiment, the gate dielectric layer comprises a first portion encircling the semiconductor region, and a second portion encircling an additional semiconductor region overlapping the semiconductor region, and wherein the p-type work-function layer comprises a third portion encircling the first portion, and a fourth portion encircling the second portion, and wherein the third portion physically joins the fourth portion. In an embodiment, the work-function tuning layer has an n-type work function, the work-function tuning layer and the p-type work-function layer in combination have a p-type work function, and wherein the source/drain region is of p-type. In an embodiment, the method further comprises depositing a titanium-containing layer over and contacting the p-type work-function layer. In an embodiment, a ratio of an aluminum atomic percentage to a carbon atomic percentage in the work-function tuning layer is in a range between about 0.1 and about 4.

In accordance with some embodiments of the present disclosure, an integrated circuit structure comprises a semiconductor region; a gate stack over the semiconductor region, the gate stack comprising a high-k gate dielectric layer; a work-function tuning layer on the high-k gate dielectric layer, wherein the work-function tuning layer comprises aluminum and carbon; and a p-type work-function layer over the work-function tuning layer; and a p-type source/drain region on a side of the gate stack. In an embodiment, the work-function tuning layer is free from peaks of titanium and nitrogen therein. In an embodiment, a ratio of an aluminum atomic percentage to a carbon atomic percentage in the work-function tuning layer is in a range between about 0.1 and about 4. In an embodiment, a ratio of a first thickness of the work-function tuning layer to a second thickness of the high-k gate dielectric layer is in a range between about 0.08 and about 2.5. In an embodiment, the p-type work-function layer comprises titanium nitride.

In accordance with some embodiments of the present disclosure, an integrated circuit structure comprises a first transistor comprising a first semiconductor region; a first gate spacer and a second gate spacer over the first semiconductor region; and a first gate stack over the first semiconductor region and between the first gate spacer and the second gate spacer, the first gate stack comprising a first high-k dielectric layer on the first semiconductor region; an n-type work-function layer over and physically contacting the first high-k dielectric layer; a first p-type work-function layer over and contacting the n-type work-function layer; and a metal region over and contacting the first p-type work-function layer; and a p-type source/drain region on a side of the first gate stack. In an embodiment, the integrated circuit structure further comprises a second transistor, the second transistor comprising a second semiconductor region; and a second gate stack comprising a second high-k dielectric layer on the second semiconductor region; and a second p-type work-function layer in physical contact with the second high-k dielectric layer. In an embodiment, the n-type work-function layer comprises aluminum and carbon. In an embodiment, a ratio of an aluminum atomic percentage to a carbon atomic percentage in the n-type work-function layer is in a range between about 0.1 and about 4.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a dummy gate stack over a semiconductor region;
    forming a source/drain region on a side of the dummy gate stack;
    removing the dummy gate stack to form a trench, with the semiconductor region being exposed to the trench;
    forming a gate dielectric layer extending into the trench;
    depositing a work-function tuning layer on the gate dielectric layer, wherein the work-function tuning layer comprises aluminum and carbon, and the depositing the work-function tuning layer comprises thermal soaking processes using a first process gas comprising aluminum, and a second process gas comprising carbon;
    depositing a p-type work-function layer over the work-function tuning layer; and
    performing a planarization process to remove excess portions of the p-type work-function layer, the work-function tuning layer, and the gate dielectric layer to form a gate stack.

2. The method of claim 1, wherein the thermal soaking process is performed at a wafer temperature in a range between about 150° C. and about 550° C.

3. The method of claim 1, wherein the first process gas is selected from the group consisting of Trimethylaluminium (TMA, $Al_2(CH_3)_6$), Triethylaluminium (TEAL, $Al_2(C_2H_5)_6$), and combinations thereof, and the second process gas comprises Tetrakis(dimethylamido) titanium (TDMAT, $C_8H_{24}N_4Ti$).

4. The method of claim 1, wherein the forming the gate dielectric layer comprises depositing a high-k dielectric layer, and wherein the work-function tuning layer is in physical contact with the high-k dielectric layer.

5. The method of claim 1, wherein the gate dielectric layer comprises a first portion encircling the semiconductor region, and a second portion encircling an additional semiconductor region overlapping the semiconductor region, and wherein the p-type work-function layer comprises a third portion encircling the first portion, and a fourth portion encircling the second portion, and wherein the third portion physically joins the fourth portion.

6. The method of claim 1, wherein the work-function tuning layer has an n-type work function, the work-function tuning layer and the p-type work-function layer in combination have a p-type work function, and wherein the source/drain region is of p-type.

7. The method of claim 1 further comprising depositing a titanium-containing layer over and contacting the p-type work-function layer.

8. The method of claim 1, wherein a ratio of an aluminum atomic percentage to a carbon atomic percentage in the work-function tuning layer is in a range between about 0.1 and about 4.

9. The method of claim 1, wherein the work-function tuning layer is in physical contact with the gate dielectric layer.

10. The method of claim 1, wherein the p-type work-function layer is in physical contact with the work-function tuning layer.

11. The method of claim 1, wherein the first process gas and the second process gas are conducted sequentially.

12. A method comprising:
    forming a gate stack over a semiconductor region, the forming the gate stack comprising:
        forming a high-k gate dielectric layer;
        forming a work-function tuning layer on the high-k gate dielectric layer, wherein the work-function tuning layer comprises aluminum and carbon, and wherein the work-function tuning layer has a ratio of an aluminum atomic percentage to a carbon atomic percentage in a range between about 0.1 and about 4; and
        forming a p-type work-function layer over the work-function tuning layer; and
    forming a p-type source/drain region on a side of the gate stack.

13. The method of claim 12, wherein the work-function tuning layer is free from peaks of titanium and nitrogen therein.

14. The method of claim 12, wherein a ratio of a first thickness of the work-function tuning layer to a second thickness of the high-k gate dielectric layer is in a range between about 0.08 and about 2.5.

15. The method of claim 12, wherein the forming the p-type work-function layer comprises depositing a titanium nitride layer.

16. The method of claim 12, wherein the work-function tuning layer is in physical contact with the high-k gate dielectric layer.

17. A method comprising:
   forming a first transistor comprising:
      forming a first gate spacer and a second gate spacer over a first semiconductor region; and
      forming a first gate stack over the first semiconductor region and between the first gate spacer and the second gate spacer, the first gate stack comprising:
         a first high-k dielectric layer on the first semiconductor region;
         an n-type work-function layer over and physically contacting the first high-k dielectric layer, wherein the n-type work-function layer comprises aluminum and carbon, and wherein a ratio of an aluminum atomic percentage to a carbon atomic percentage in the n-type work-function layer is in a range between about 0.1 and about 4;
         a first p-type work-function layer over and contacting the n-type work-function layer; and
      forming a metal region over and contacting the first p-type work-function layer; and
   forming a p-type source/drain region aside of the first gate stack.

18. The method of claim 17 further comprising forming a second transistor, the forming the second transistor comprising:
   forming a second gate stack comprising:
      forming a second high-k dielectric layer on a second semiconductor region; and
      forming a second p-type work-function layer in physical contact with the second high-k dielectric layer.

19. The method of claim 17, wherein the n-type work-function layer is in physical contact with the first high-k dielectric layer, and the first p-type work-function layer is in physical contact with the n-type work-function layer.

20. The method of claim 1, wherein the depositing the work-function tuning layer comprises a plurality of cycles, each comprising conducting the first process gas and the second process gas sequentially.

* * * * *